(12) United States Patent
Shin et al.

(10) Patent No.: US 12,527,129 B2
(45) Date of Patent: Jan. 13, 2026

(54) DISPLAY DEVICE AND METHOD OF FABRICATING THE SAME

(71) Applicant: Samsung Display Co., LTD., Yongin-si (KR)

(72) Inventors: Dong Geun Shin, Yongin-si (KR); Tae Min Kim, Yongin-si (KR); Bong Sung Seo, Yongin-si (KR); Gi Hoon Yang, Yongin-si (KR); Seul Gee Lee, Yongin-si (KR); Ho Lim, Yongin-si (KR); Suk Kung Chei, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 812 days.

(21) Appl. No.: 17/837,683

(22) Filed: Jun. 10, 2022

(65) Prior Publication Data

US 2023/0155069 A1 May 18, 2023

(30) Foreign Application Priority Data

Nov. 12, 2021 (KR) .................. 10-2021-0155959

(51) Int. Cl.
*H10H 20/84* (2025.01)
*H10H 20/01* (2025.01)

(52) U.S. Cl.
CPC ............ *H10H 20/84* (2025.01); *H10H 20/01* (2025.01); *H10H 20/034* (2025.01)

(58) Field of Classification Search
CPC ....... H10H 20/01; H10H 20/84; H10H 20/034

USPC ........................................ 257/141
See application file for complete search history.

(56) References Cited

U.S. PATENT DOCUMENTS

| 10,910,593 | B2 | 2/2021 | Joo et al. | |
|---|---|---|---|---|
| 12,374,663 | B2 | 7/2025 | Lee et al. | |
| 2004/0036410 | A1* | 2/2004 | Park | H10K 59/38 313/504 |
| 2014/0254021 | A1 | 9/2014 | Furui et al. | |
| 2018/0188837 | A1* | 7/2018 | Son | H10K 59/122 |
| 2019/0326545 | A1* | 10/2019 | Joo | G06F 3/0412 |
| 2022/0077228 | A1* | 3/2022 | Do | H10H 20/831 |
| 2022/0344379 | A1* | 10/2022 | Yun | H01L 25/167 |

FOREIGN PATENT DOCUMENTS

| JP | 2015-22171 A | 2/2015 |
|---|---|---|
| KR | 2001-0004912 A | 1/2001 |
| KR | 10-2008-0068286 A | 7/2008 |
| KR | 10-1408663 | 6/2014 |
| KR | 10-1718864 | 3/2017 |
| KR | 10-1934607 | 1/2019 |
| KR | 10-2019-0122919 A | 10/2019 |
| KR | 10-2020-0027136 A | 3/2020 |

* cited by examiner

*Primary Examiner* — Igwe U Anya
(74) *Attorney, Agent, or Firm* — Womble Bond Dickinson (US) LLP

(57) ABSTRACT

Provided herein may be a display device and a method of fabricating the same. The display device may include a substrate including pixels, color filters disposed on the substrate and overlapping the pixels, protrusion patterns disposed on a boundary between the pixels, with a step difference formed between the protrusion patterns and the color filters, and an overcoat layer formed with a uniform thickness on the color filters and the protrusion patterns.

20 Claims, 15 Drawing Sheets

DISPLAY DEVICE AND METHOD OF FABRICATING THE SAME

CROSS-REFERENCE TO RELATED APPLICATION(S)

The application claims priority to Korean patent application 10-2021-0155959 filed on Nov. 12, 2021, the entire disclosure of which is incorporated herein in its entirety by reference.

BACKGROUND

1. Technical Field

Embodiments of the disclosure relate to a display device and a method of fabricating the display device.

2. Description of the Related Art

Recently, as interest in information displays has increased, research and development on display devices have been continuously conducted.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments of the disclosure are directed to a display device having antiglare characteristics, and a method of fabricating the same.

The objects of the disclosure are not limited to the above-stated objects, and those skilled in the art will clearly understand other not mentioned objects from the accompanying claims.

A display device in accordance with an embodiment may include pixels disposed on a substrate, color filters disposed on the substrate and overlapping the pixels in a plan view, protrusion patterns disposed on a boundary between the pixels, the protrusion patterns and the color filters having a step difference, and an overcoat layer having a uniform thickness disposed on the color filters and the protrusion patterns.

The overcoat layer may include a first area overlapping each of the color filters in a plan view, and a second area overlapping each of the protrusion patterns in a plan view.

The first area and the second area may have a step difference.

A thickness of the overcoat layer may be about 10 µm or less.

The step difference of the color filters and the protrusion patterns may be in a range of about 2 µm to about 5 µm.

The pixels may include a first pixel, a second pixel, and a third pixel. The color filters may include a first color filter overlapping the first pixel in a plan view, a second color filter overlapping the second pixel in a plan view, and a third color filter overlapping the third pixel in a plan view.

The protrusion patterns may include a first color pattern, a second color pattern, and a third color pattern. The first color pattern, the second color pattern and the third color pattern, and the first color filter, the second color filter, and the third color filter may respectively include a same material.

Each of the protrusion patterns may include a light shielding layer.

The display device may further include electrodes disposed in the pixels, the electrodes being spaced apart from each other, and light emitting elements disposed between the electrodes.

Each of the light emitting elements may include a first semiconductor layer, a second semiconductor layer, and an active layer disposed between the first semiconductor layer and the second semiconductor layer.

The overcoat layer may include a polyhedral oligomeric silsesquioxane (POSS) compound.

A method of fabricating a display device in accordance with an embodiment may include preparing a substrate that includes pixels, forming color filters that overlap the pixels in a plan view, forming protrusion patterns on a boundary between the pixels, the protrusion patterns and the color filters having a step difference, and forming an overcoat layer having a uniform thickness on the color filters and the protrusion patterns.

Forming the overcoat layer may include applying an overcoat ink by inkjet printing.

A viscosity of the overcoat ink may be in a range of about 4 cP to about 20 cP.

The overcoat ink may have a weight-average molecular weight of about 30,000 or more.

The overcoat ink may include a polyhedral oligomeric silsesquioxane (POSS) compound.

The step difference of the protrusion patterns and the color filters may be in a range of about 2 µm to about 5 µm.

The method may further include forming electrodes on the substrate, the electrodes being spaced apart from each other, and aligning light emitting elements between the electrodes.

The method may further include forming a color conversion layer between the light emitting elements and the color filters.

The protrusion patterns may be formed of color patterns, the color patterns and the color filters including a same material.

Details of embodiments are included in the detailed descriptions and drawings.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
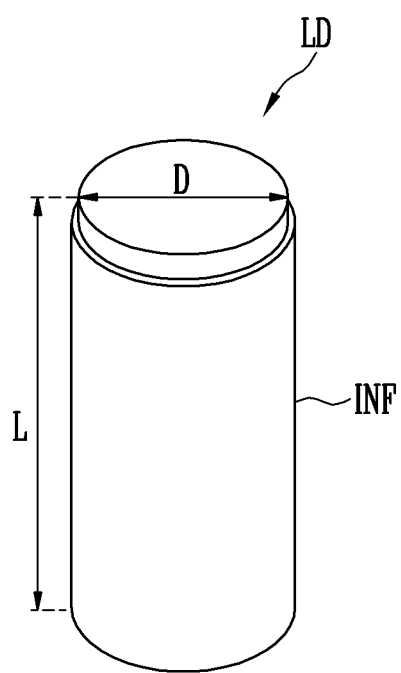
FIG. 1 is a schematic perspective view illustrating a light emitting element in accordance with an embodiment.

Advantages and features of the disclosure, and methods for achieving the same will be described with reference to embodiments described in detail together with the accompanying drawings. The disclosure is not limited to the following embodiments, and modifications are possible. These embodiments are provided so that this disclosure will be thorough and complete and will fully convey the concept of the disclosure to those skilled in the art, and the disclosure will only be defined by the appended claims.

The terminology used herein is for the purpose of describing particular embodiments only and is not intended to be limiting of embodiments in this specification, the terms of a singular form may include plural forms unless specifically mentioned. It will be further understood that the terms "comprises" and/or "comprising," when used in this specification, specify the presence of stated features, steps, operations and/or components do not preclude the presence or addition of one or more features, steps, operations and/or components.

Furthermore, the term "coupling" or "connection" may comprehensively refer to physical and/or electrical coupling or connection. In addition, the term "coupling" or "connection" may comprehensively refer to direct or indirect coupling or connection and integral or non-integral coupling or connection.

It will be understood that in case that an element or a layer is referred to as being "on" another element or a layer, it can be directly on, connected to, or coupled to the other element or the layer, or one or more intervening elements or layers may be present. Like reference numerals refer to like elements throughout.

It will be understood that, although the terms "first," "second," etc. may be used herein to describe elements, these elements should not be limited by these terms. These terms are only used to distinguish one element from another element. For instance, a first element discussed below could be termed a second element without departing from the teachings of the disclosure.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

The phrase "in a plan view" means viewing the object from the top, and the phrase "in a schematic cross-sectional view" means viewing a cross-section of which the object is vertically cut from the side.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

"About," "substantially," or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the disclosure will be described in detail with reference to the accompanying drawings.

Figure 2:
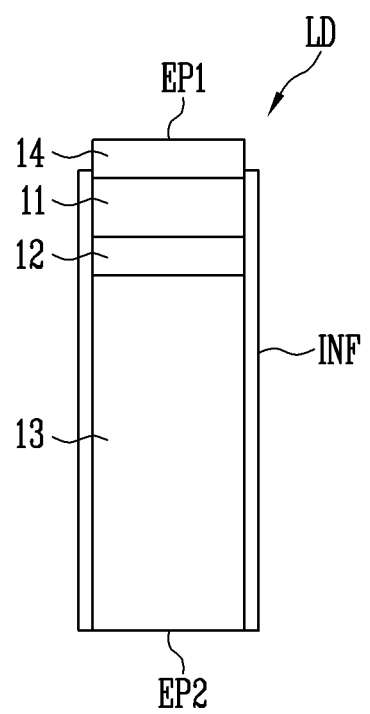
FIG. 2 is a schematic sectional view illustrating the light emitting element in accordance with an embodiment.

FIG. 1 is a schematic perspective view illustrating a light emitting element in accordance with an embodiment. FIG. 2 is a schematic sectional view illustrating a light emitting element in accordance with an embodiment. Although FIGS. 1 and 2 illustrate a column-type light emitting element LD, the type and/or shape of the light emitting element LD is not limited thereto.

Referring to FIGS. 1 and 2, the light emitting element LD may include a first semiconductor layer 11, an active layer 12, a second semiconductor layer 13, and/or an electrode layer 14.

The light emitting element LD may be provided in the form of a column extending in a direction. The light emitting element LD may include a first end EP1 and a second end EP2. One of the first and second semiconductor layers 11 and 13 may be disposed on the first end EP1 of the light emitting element LD. The other of the first and second semiconductor layers 11 and 13 may be disposed on the second end EP2 of the light emitting element LD. For example, the first semiconductor layer 11 may be disposed on the first end EP1 of the light emitting element LD, and the second semiconductor layer 13 may be disposed on the second end EP2 of the light emitting element LD.

In an embodiment, the light emitting element LD may be a light emitting element fabricated in a column shape through an etching scheme or the like. In the specification, the term "column-type" embraces a rod-like shape and a bar-like shape such as a cylindrical shape and a prismatic shape having an aspect ratio greater than 1, and the cross-sectional shape thereof is not limited.

The light emitting element LD may have a small size corresponding to a range of a nanometer scale to a micrometer scale. For example, each light emitting element LD may have a diameter D (or a width) and/or a length L ranging from the nanometer scale to the micrometer scale. However, the size of the light emitting element LD is not limited thereto, and the size of the light emitting element LD may be changed depending on design conditions of the devices, for example, a display device, using a light emitting device with the light emitting element LD as a light source.

The first semiconductor layer 11 may be a first conductive semiconductor layer. For example, the first semiconductor layer 11 may include a p-type semiconductor layer. For instance, the first semiconductor layer 11 may include a p-type semiconductor layer which includes a semiconductor material such as InAlGaN, GaN, AlGaN, InGaN, or AlN, and is doped with a first conductive dopant such as Mg. However, the material for forming the first semiconductor layer 11 is not limited thereto, and other materials may be used to form the first semiconductor layer 11. The active layer 12 may be disposed between the first semiconductor layer 11 and the second semiconductor layer 13. The active layer 12 may include a single well structure, a multi-well structure, a single-quantum well structure, a multi-quantum well (MQW) structure, a quantum dot structure, or a quantum line structure, but the disclosure is not limited thereto. The active layer 12 may include GaN, InGaN, InAlGaN, AlGaN, or AlN. Other materials may be used to form the active layer 12.

If a voltage equal to or greater than a threshold voltage is applied between the opposite ends of the light emitting element LD, the light emitting element LD may emit light by coupling of electron-hole pairs in the active layer 12. Since light emission of the light emitting element LD can be controlled based on the foregoing principle, the light emitting element LD may be used as a light source for light emitting devices as well as a pixel of the display device.

The second semiconductor layer 13 may be disposed on the active layer 12 and include a semiconductor layer having a type different from that of the first semiconductor layer 11. The second semiconductor layer 13 may include an n-type semiconductor layer. For instance, the second semiconductor layer 13 may include an n-type semiconductor layer which includes a semiconductor material such as InAlGaN, GaN, AlGaN, InGaN, and AlN, and is doped with a second conductive dopant such as Si, Ge, or Sn. However, the material for forming the second semiconductor layer 13 is not limited thereto, and the second semiconductor layer 13 may be formed of other materials.

The electrode layer 14 may be disposed on the first end EP1 and/or the second end EP2 of the light emitting element LD. Although FIG. 2 illustrates electrode layer 14 formed on the first semiconductor layer 11, the disclosure is not limited thereto. For example, a separate electrode layer may be further disposed on the second semiconductor layer 13.

The electrode layer 14 may include a transparent metal or transparent metal oxide. For example, the electrode layer 14 may include at least one of indium tin oxide (ITO), indium zinc oxide (IZO), and zinc tin oxide (ZTO), but the disclosure is not limited thereto. As such, in case that the electrode layer 14 is formed of transparent metal or transparent metal oxide, light generated from the active layer 12 of the light emitting element LD may be emitted out of the light emitting element LD through the electrode layer 14.

An insulating layer INF may be provided on a surface of the light emitting element LD. The insulating layer INF may be disposed (for example, directly disposed) on a surface of the first semiconductor layer 11, a surface of the active layer 12, a surface of the second semiconductor layer 13, and/or a surface of the electrode layer 14. The insulating layer INF may allow the first and second ends EP1 and EP2 of the light emitting element LD that have different polarities to be exposed. In an embodiment, the insulating layer INF may allow a sidewall of the electrode layer 14 and/or the second semiconductor layer 13 disposed adjacent to the first and second ends EP1 and EP2 of the light emitting element LD to be exposed.

The insulating layer INF may prevent short-circuits that may occur from the active layer 12 contacting conductive material other than the first and second semiconductor layers 11 and 13. Furthermore, the insulating layer INF may minimize surface defects of the light emitting elements LD, thus enhancing the lifetime and emission efficiency of the light emitting elements LD.

The insulating layer INF may include at least one of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium dioxide ($TiO_x$). For example, the insulating layer INF may have a double layer structure, and respective layers that form the double layer structure may include different materials. For example, the insulating layer INF may have a double layer structure formed of aluminum oxide ($AlO_x$) and silicon oxide ($SiO_x$), but the disclosure is not limited thereto. In an embodiment, the insulating layer INF may be omitted.

A light emitting device including the light emitting element LD described above may be used not only in a display device but also in devices which require a light source. For instance, light emitting elements LD may be disposed in each pixel of a display panel, so that the light emitting elements LD may be used as a light source of the pixel. However, the application field of the light emitting element LD is not limited to these examples. For example, the light emitting element LD may also be used in other types of devices such as a lighting device, which requires a light source.

Figure 3:
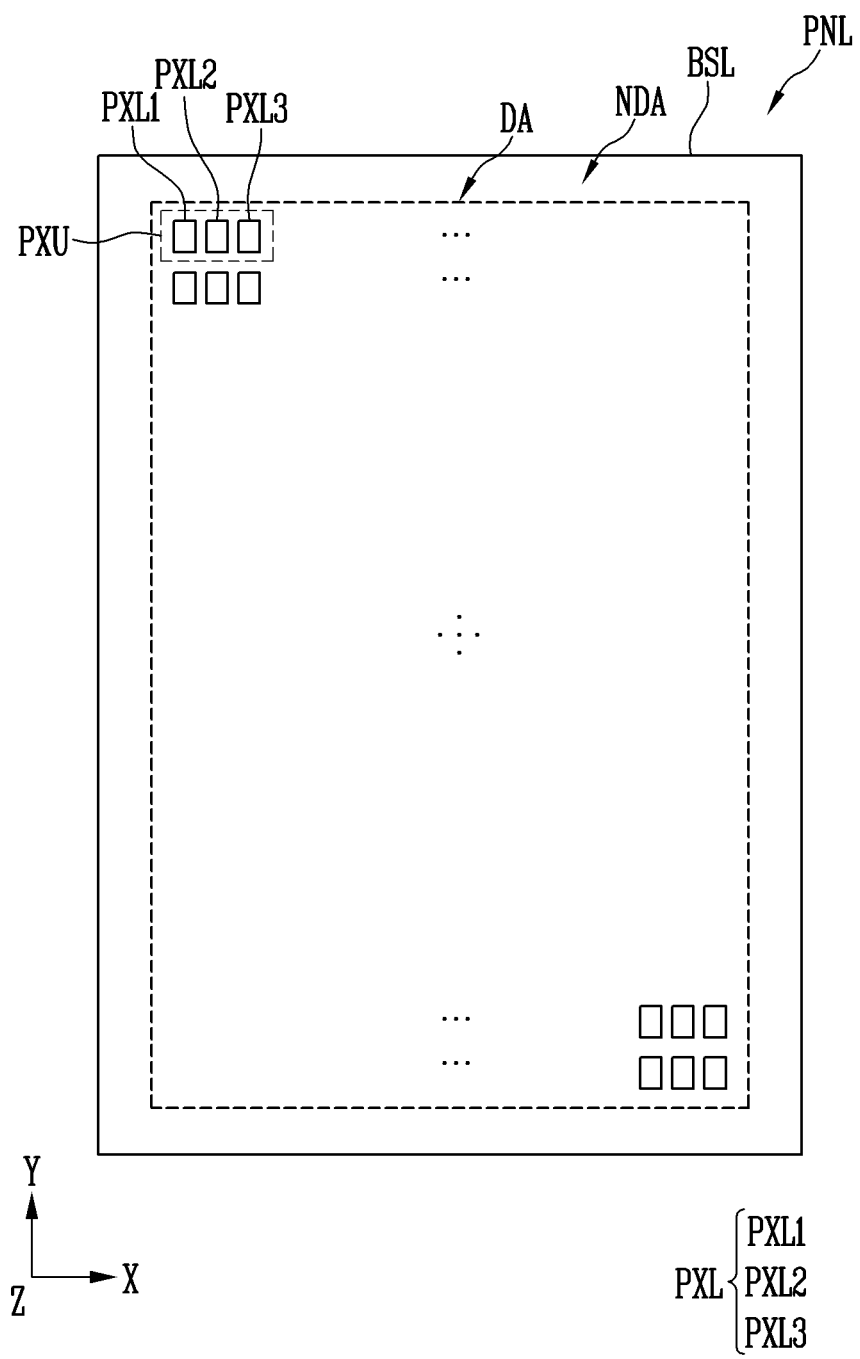
FIG. 3 is a schematic plan view illustrating a display device in accordance with an embodiment.

FIG. 3 is a schematic plan view illustrating a display device in accordance with an embodiment.

FIG. 3 illustrates a display device including a display panel PNL, as an example of an electronic device which may use the light emitting element LD described in FIGS. 1 and 2 as a light source.

FIG. 3 illustrates the structure of the display panel PNL in accordance with an embodiment, focused on a display area DA. In some embodiments, although not illustrated, at least one driving circuit (for example, at least one of a scan driver and a data driver), lines, and/or pads may be further provided on the display panel PNL.

Referring to FIG. 3, the display panel PNL and the base layer BSL for forming the display panel PNL may include a display area DA for displaying an image, and a non-display area NDA that excludes the display area DA.

The display area DA may form a screen on which an image is displayed. The non-display area NDA may be the remaining area other than the display area DA.

A pixel unit PXU may be disposed in the display area DA. The pixel unit PXU may include a first pixel PXL1, a second pixel PXL2, and/or a third pixel PXL3. Hereinafter, the term "pixel PXL" or "pixels PXL" will be used to designate the first pixel PXL1, the second pixel PXL2, or the third pixel PXL3, or collectively designate two or more kinds of pixels.

The pixels PXL may be regularly arranged according to a stripe or PENTILE™ arrangement structure. The arrangement structure of the pixels PXL is not limited thereto, and the pixels PXL may be arranged in the display area DA in a variety structures and/or schemes.

In an embodiment, two or more kinds of pixels PXL which emit different colors of light may be disposed in the display area DA. For example, first pixels PXL1 that may emit a first color light, second pixels PXL2 that may emit a second color light, and third pixels PXL3 that may emit a third color light may be arranged in the display area DA. At least one first pixel PXL1, at least one second pixel PXL2, and at least one third pixel PXL3 that are adjacent to each other may form a pixel unit PXU which may emit various colors of light. For example, each of the first to third pixels PXL1, PXL2, and PXL3 may be a pixel that emits a color of light. In an embodiment, the first pixel PXL1 may be a red pixel that emits red light, a second pixel PXL2 may be a green pixel that emits green light, and a third pixel PXL3 may be a blue light that emits blue light. However, the disclosure is not limited thereto.

In an embodiment, the first pixel PXL1, the second pixel PXL2, and the third pixel PXL3 may respectively include light emitting elements that emit the same color of light, and color conversion layers and/or color filter layers pertaining to different colors may be disposed on the respective light emitting elements so that the pixels may respectively emit the first color of light, the second color of light, and the third color of light. In an embodiment, the first pixel PXL1, the second pixel PXL2, and the third pixel PXL3 may include, as light sources, a light emitting element related to the first color, a light emitting element related to the second color, and a light emitting element related to the third color, so that the pixels may respectively emit the first color of light, the second color of light, and the third color of light. However, the colors, the types, and/or the number of pixels PXL that form each pixel unit PXU are not particularly limited. The color of light to be emitted from each pixel PXL may be changed s.

The pixel PXL may include at least one light source which is driven by a control signal (for example, a scan signal and a data signal) and/or a power supply (for example, a first power supply and a second power supply). In an embodiment, the light source may include at least one light emitting element LD in accordance with the embodiments of FIGS. 1 and 2, for example, subminiature column-type light emitting elements LD having a small size corresponding to a range of a nanometer scale to a micrometer scale. However, the disclosure is not limited thereto, and different types of light emitting elements LD may be used as a light source of the pixel PXL.

In an embodiment, each pixel PXL may be formed of an active pixel. However, the types, structures, and/or driving schemes of the pixels PXL applicable to the display device are not particularly limited. For example, each pixel PXL may be formed of a pixel for passive or active light emitting display devices which have other structures and/or may be operated with other driving schemes.

Figure 4:
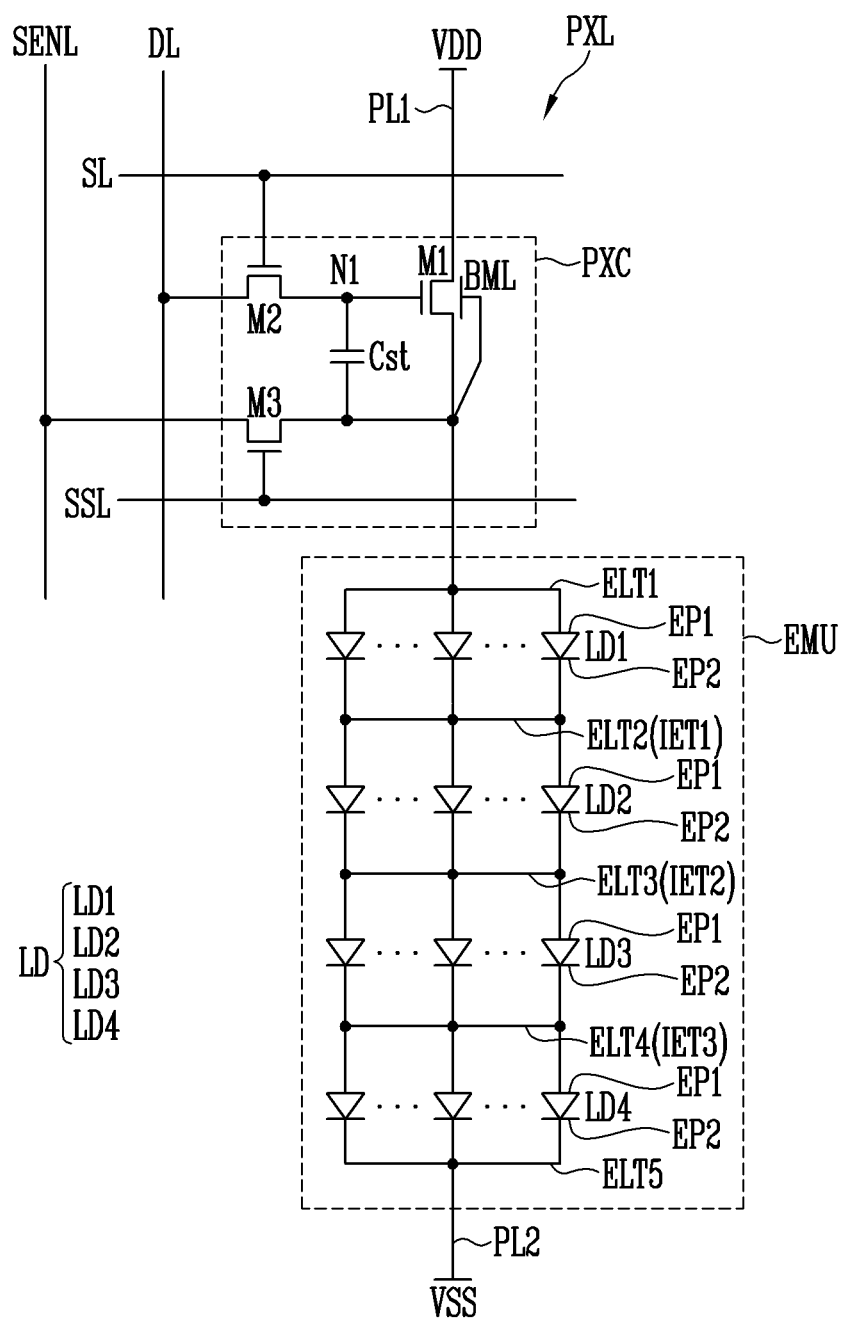
FIG. 4 is a schematic diagram of an equivalent circuit illustrating a pixel in accordance with an embodiment.

FIG. 4 is a schematic diagram of an equivalent circuit illustrating a pixel in accordance with an embodiment.

In an embodiment, the pixel PXL illustrated in FIG. 4 may be any of the first pixel PXL1, the second pixel PXL2, and the third pixel PXL3 which are provided on the display panel PNL of FIG. 3. The first pixel PXL1, the second pixel PXL2, and the third pixel PXL3 may have a substantially identical or similar structure.

Referring to FIG. 4, each pixel PXL may include an emission circuit EMU that generates light having luminance corresponding to a data signal, and a pixel circuit PXC that drives the emission circuit EMU.

The pixel circuit PXC may be connected between the first power supply VDD and the emission circuit EMU. Furthermore, the pixel circuit PXC may be electrically connected to a scan line SL and a data line DL of the corresponding pixel PXL, and control the operation of the emission circuit EMU in response to a scan signal and a data signal supplied from the scan line SL and the data line DL. Furthermore, the pixel circuit PXC may be electrically connected selectively to a sensing signal line SSL and a sensing line SENL.

The pixel circuit PXC may include at least one transistor and at least one capacitor. For example, the pixel circuit PXC may include a first transistor M1, a second transistor M2, a third transistor M3, and a storage capacitor Cst.

The first transistor M1 may be electrically connected between the first power supply VDD and a first connection electrode ELT1. A gate electrode of the first transistor M1 may be electrically connected to the first node N1. The first transistor M1 may control driving current to be supplied to the emission circuit EMU in response to a voltage of the first node N1. The first transistor M1 may be a driving transistor configured to control the driving current of the pixel PXL.

In an embodiment, the first transistor M1 may selectively include a bottom conductive layer BML (referred also to as "bottom electrode", "back gate electrode" or "bottom light shielding layer"). The gate electrode of the first transistor M1 and the bottom conductive layer BML may overlap each other in a plan view with an insulating layer interposed therebetween. In an embodiment, the bottom conductive layer BML may be connected to an electrode of the first transistor M1, for example, a source or drain electrode of the first transistor M1.

In case that the first transistor M1 includes the bottom conductive layer BML, a back-biasing technique (or a sync technique) may be used. The back-biasing technique may be a technique of shifting a threshold voltage of the first transistor M1 in a negative direction or a positive direction by applying a bank-biasing voltage to the bottom conductive layer BML of the first transistor M1 when the pixel PXL is driven. For example, a source-sync technique may be used by electrically connecting the bottom conductive layer BML to the source electrode of the first transistor M1, so that the threshold voltage of the first transistor M1 may be shifted in the negative direction or the positive direction. In case that the bottom conductive layer BML is disposed under a semiconductor pattern that forms a channel of the first transistor M1, the bottom conductive layer BML may function as a light shielding pattern and stabilize operating characteristics of the first transistor M1. However, the function and/or application scheme of the bottom conductive layer BML is not limited thereto.

The second transistor M2 may be electrically connected between the data line DL and the first node N1. A gate electrode of the second transistor M2 may be electrically connected to the scan line SL. When a scan signal having a gate-on voltage (for example, a high-level voltage) is supplied from the scan line SL, the second transistor M2 may be turned on to electrically connect the data line DL with the first node N1.

During each frame period, a data signal of a corresponding frame may be supplied to the data line DL, and the data signal may be transmitted to the first node N1 through the second transistor M2 that is turned on during a period in which the scan signal having the gate-on voltage is supplied to the scan line SL. The second transistor M2 may be a switching transistor that transmits each data signal to the interior of the pixel PXL.

One electrode of the storage capacitor Cst may be electrically connected to the first node N1, and the other electrode thereof may be electrically connected to a second electrode of the first transistor M1. The storage capacitor Cst may be charged with a voltage corresponding to a data signal to be supplied to the first node N1 during each frame period.

The third transistor M3 may be electrically connected between the first connection electrode ELT1 (or the second electrode of the first transistor M1) and the sensing line SENL. A gate electrode of the third transistor M3 may be electrically connected to the sensing signal line SSL. The third transistor M3 may transmit a voltage value applied to the first connection electrode ELT1, to the sensing line SENL in response to a sensing signal supplied to the sensing signal line SSL. The voltage value transmitted through the sensing line SENL may be provided to an external circuit (for example, a timing controller). The external circuit may extract information about characteristics of each pixel PXL (for example, a threshold voltage of the first transistor M1, etc.) based on the provided voltage value. The extracted characteristic information may be used to convert image data to compensate for a deviation in characteristics between the pixels PXL.

Although in FIG. 4, all of the transistors included in the pixel circuit PXC are formed of n-type transistors, the disclosure is not certainly limited thereto. For example, at least one of the first, second, and third transistors M1, M2, and M3 may be a p-type transistor.

The structure and driving scheme of the pixel PXL may be changed. For instance, the pixel circuit PXC may not only be formed of the pixel circuit of the embodiment illustrated in FIG. 4 but may also be formed of a pixel circuit which may have other structures and/or be operated with other driving schemes.

For example, the pixel circuit PXC may not include the third transistor M3. Furthermore, the pixel circuit PXC may further include other circuit elements such as a compensation transistor that compensates for the threshold voltage of the first transistor M1, an initialization transistor that initializes the voltage of the first node N1 and/or the first connection electrode ELT1, an emission control transistor that controls a period in which driving current is supplied to the emission circuit EMU, and/or a boosting capacitor that boosts the voltage of the first node N1.

The emission circuit EMU may include at least one light emitting element LD, for example, multiple light emitting elements LD electrically connected between the first power supply VDD and the second power supply VSS.

For example, the emission circuit EMU may include a first connection electrode ELT1 electrically connected to the first power supply VDD by the pixel circuit PXC and a first power line PL1, a fifth connection electrode ELT5 electrically connected to the second power supply VSS by a second power line PL2, and a plurality of light emitting elements LD electrically connected between the first and fifth connection electrodes ELT1 and ELT5.

The first power supply VDD and the second power supply VSS may have different potentials to allow the light emitting elements LD to emit light. For example, the first power supply VDD may be set as a high-potential power supply, and the second power supply VSS may be set as a low-potential power supply.

In an embodiment, the emission circuit ENU may include at least one serial stage. Each serial stage may include a pair of electrodes (for example, two electrodes), and at least one light emitting element LD connected in a forward direction between the pair of electrodes. Here, the number of serial stages that form the emission circuit EMU and the number of light emitting elements LD that form each serial stage are not particularly limited. For example, the numbers of light emitting elements LD that form the respective serial stages may be identical with or different from each other. The number of light emitting elements LD of each serial stage is not particularly limited.

For example, the emission circuit EMU may include a first serial stage including at least one first light emitting element LD1, a second serial stage including at least one second light emitting element LD2, a third serial stage including at least one third light emitting element LD3, and a fourth serial stage including at least one fourth light emitting element LD4.

The first serial stage may include a first connection electrode ELT1, a second connection electrode ELT2, and at least one first light emitting element LD1 electrically connected between the first and second connection electrodes ELT1 and ELT2. Each first light emitting element LD1 may be electrically connected in the forward direction between the first and second connection electrodes ELT1 and ELT2. For example, a first end EP1 of the first light emitting element LD1 may be electrically connected to the first connection electrode ELT1. A second end EP2 of the first light emitting element LD1 may be electrically connected to the second connection electrode ELT2.

The second serial stage may include the second connection electrode ELT2, a third connection electrode ELT3, and at least one second light emitting element LD2 electrically connected between the second and third connection electrodes ELT2 and ELT3. Each second light emitting element LD2 may be electrically connected in the forward direction between the second and third connection electrodes ELT2 and ELT3. For example, a first end EP1 of the second light emitting element LD2 may be electrically connected to the second connection electrode ELT2. A second end EP2 of the second light emitting element LD2 may be electrically connected to the third connection electrode ELT3.

The third serial stage may include the third connection electrode ELT3, a fourth connection electrode ELT4, and at least one third light emitting element LD3 connected between the third and fourth connection electrodes ELT3 and ELT4. Each third light emitting element LD3 may be electrically connected in the forward direction between the third and fourth connection electrodes ELT3 and ELT4. For example, a first end EP1 of the third light emitting element LD3 may be electrically connected to the third connection electrode ELT3. A second end EP2 of the third light emitting element LD3 may be electrically connected to the fourth connection electrode ELT4.

The fourth serial stage may include the fourth connection electrode ELT4, a fifth connection electrode ELT5, and at least one fourth light emitting element LD4 electrically connected between the fourth and fifth connection electrodes ELT4 and ELT5. Each fourth light emitting element LD4 may be electrically connected in the forward direction between the fourth and fifth connection electrodes ELT4 and ELT5. For example, a first end EP1 of the fourth light emitting element LD4 may be electrically connected to the fourth connection electrode ELT4. A second end EP2 of the fourth light emitting element LD4 may be electrically connected to the fifth connection electrode ELT5.

The 1st electrode of the emission circuit EMU, for example, the first connection electrode ELT1, may be an anode electrode of the emission circuit EMU. The last electrode of the emission circuit EMU, for example, the fifth connection electrode ELT5, may be a cathode electrode of the emission circuit EMU.

The other electrodes of the emission circuit EMU, for example, the second connection electrode ELT2, the third connection electrode ELT3, and/or the fourth connection electrode ELT4, each may form an intermediate electrode. For example, the second connection electrode ELT2 may form a first intermediate electrode IET1. The third connection electrode ELT3 may form a second intermediate electrode IET2. The fourth connection electrode ELT4 may form a third intermediate electrode IET3.

In case that the light emitting elements LD are electrically connected in a serial/parallel structure, power efficiency may be enhanced, compared to the case where the same number of light emitting elements LD are connected only in parallel to each other. Furthermore, in the pixel PXL in which the light emitting elements LD are electrically connected in the serial/parallel structure, even if a short-circuit defect or the like occurs in some serial stages, sufficient luminance can be expressed by the light emitting elements LD of the other serial stages, so that the probability of occurrence of a black spot defect in the pixel PXL can be reduced. However, the disclosure is not limited thereto. The emission circuit EMU may be formed by electrically connecting the light emitting elements LD only in series. In other examples, the emission circuit EMU may be formed by electrically connecting the light emitting elements LD only in parallel.

Each of the light emitting elements LD may include a first end EP1 (for example, a p-type end) electrically connected to the first power supply VDD via at least one electrode (for example, the first connection electrode ELT1), the pixel circuit PXC, and/or the first power line PL1, etc., and a second end EP2 (for example, an n-type end) electrically connected to the second power supply VSS via at least another electrode (for example, the fifth connection electrode ELT5), and the second power line PL2, etc. The light emitting elements LD may be electrically connected in the forward direction between the first power supply VDD and the second power supply VSS. The light emitting elements LD electrically connected in the forward direction may form valid light sources of the emission circuit EMU.

The light emitting elements LD may emit, when driving current is supplied thereto through the corresponding pixel circuit PXC, light having luminance corresponding to the driving current. For example, during each frame period, the pixel circuit PXC may supply driving current corresponding to a gray scale value to be expressed in a corresponding frame to the light emitter EMU. Hence, the light emitting elements LD may emit light having luminance corresponding to the driving current, so that the emission circuit EMU may express the luminance corresponding to the driving current.

Figure 5:
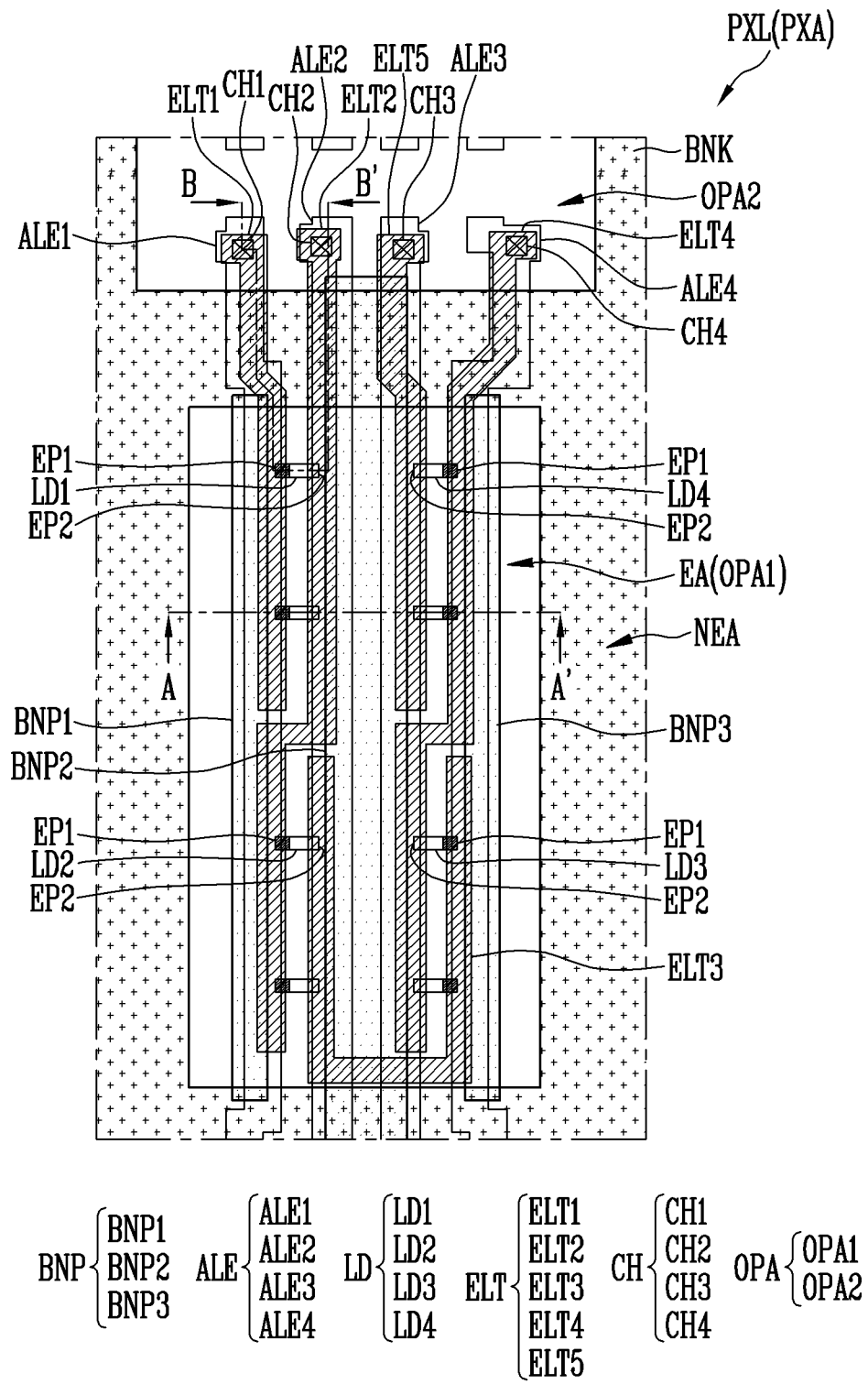
FIG. 5 is a schematic plan view illustrating a pixel in accordance with an embodiment.
Figure 6:
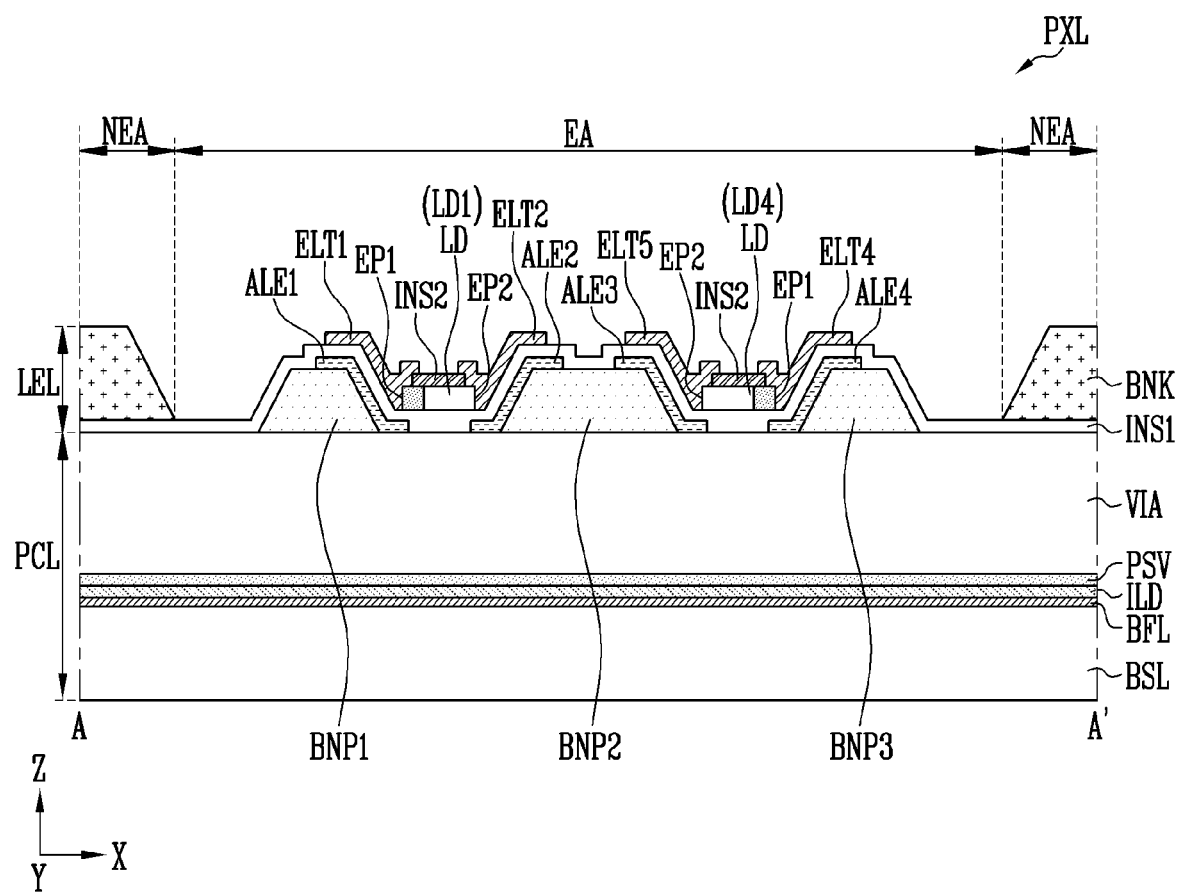
FIG. 6 is a schematic sectional view taken along a line A-A' of FIG. 5.
Figure 7:
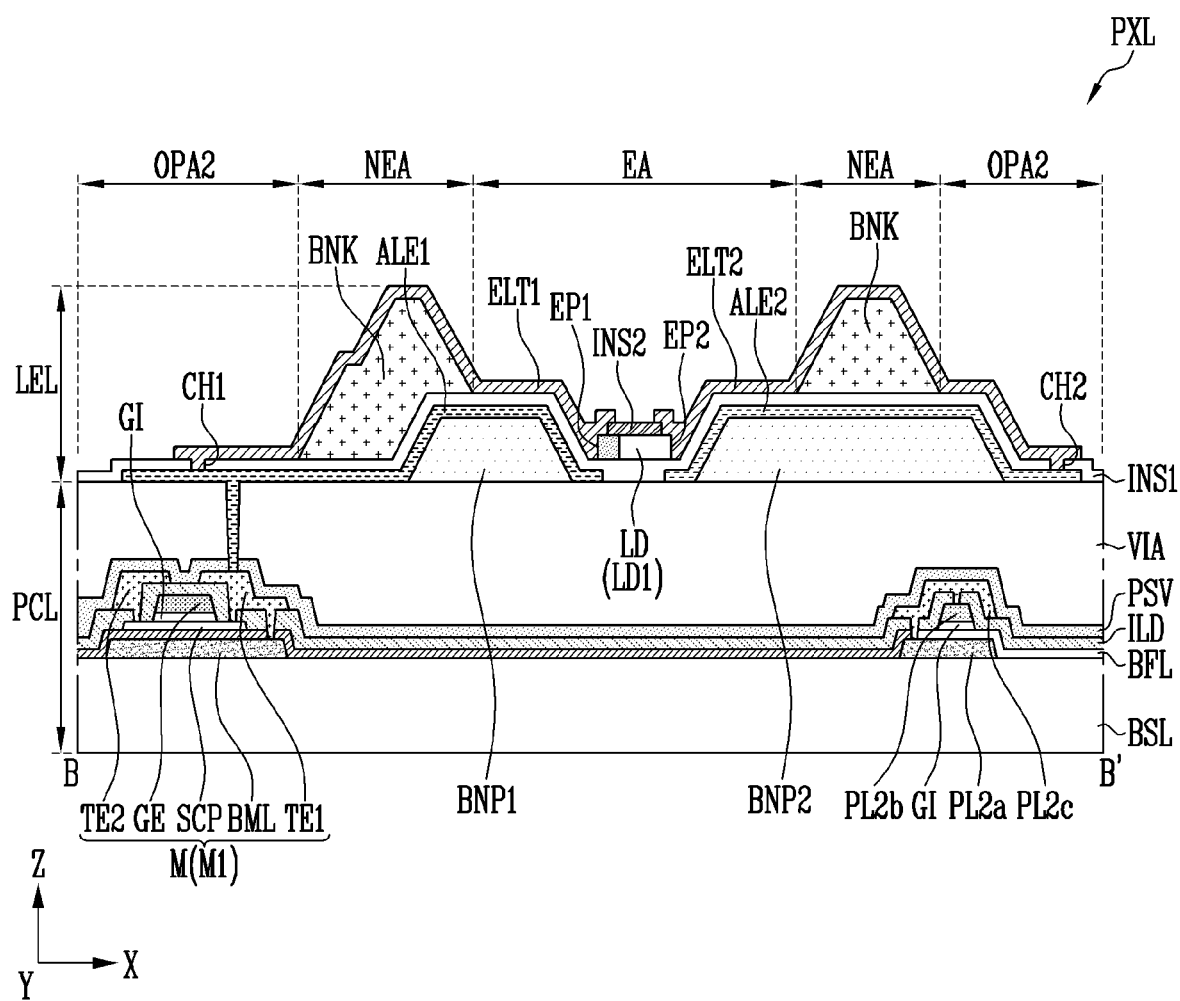
FIG. 7 is a schematic sectional view taken along a line B-B' of FIG. 5.

FIG. 5 is a schematic plan view illustrating a pixel in accordance with an embodiment. FIG. 6 is a sectional view taken along a line A-A' of FIG. 5. FIG. 7 is a schematic sectional view taken along a line B-B' of FIG. 5.

For example, the pixel PXL of FIG. 5 may be any of the first to third pixels PXL1, PXL2, and PXL3 that form the pixel unit PXU of FIG. 3, and the first to third pixels PXL1, PXL2, and PXL3 may have substantially identical or similar structures. Although FIG. 5 illustrates an embodiment in which, as illustrated in FIG. 4, each pixel PXL includes light emitting elements LD disposed in four serial stages, the number of serial stages in the pixel PXL may be changed depending on embodiments.

Hereinafter, the term "light emitting element LD," or "light emitting elements LD" will be used to designate at least one light emitting element of the first to fourth light emitting elements LD1, LD2, LD3, and LD4, or collectively designate two or more kinds of light emitting elements. Furthermore, the term "electrode ALE" or "electrodes ALE" will be used to designate at least one of the electrodes including the first to fourth electrodes ALE1, ALE2, ALE3, and ALE4. The term "connection electrode ELT" or "connection electrode ELT" will be used to designate at least one of the electrodes including the first to fifth connection electrodes ELT1, ELT2, ELT3, ELT4, and ELT5.

Referring to FIG. 5, each pixel PXL may include an emission area EA and a non-emission area NEA. The emission area EA may be an area which includes light emitting elements LD and is able to emit light. The non-emission area NEA may be disposed to enclose the emission area EA. The non-emission area NEA may be an area where a bank BNK enclosing the emission area EA is provided. The bank BNK may include a first opening area OPA1 which overlaps the emission area EA, and a second opening area OPA2 which overlaps the non-emission area NEA.

The pixels PXL each may include electrodes ALE, light emitting elements LD, and/or connection electrodes ELT. The electrodes ALE may be provided in at least the emission area EA. The electrodes ALE may extend in a second direction (a Y-axis direction) and be spaced apart from each other in a first direction (an X-axis direction). The electrodes ALE may extend from the emission area EA to the non-emission area NEA. For example, the electrodes ALE may extend from the emission area EA to the second opening area OPA2. The first to fourth electrodes ALE1, ALE2, ALE3, and ALE4 each may extend in the second direction (the Y-axis direction), and may be spaced apart from each other in the first direction (the X-axis direction) and successively disposed.

Some of the electrodes ALE may be electrically connected to the pixel circuit (PXC of FIG. 4) and/or a power line. For example, the first electrode ALE1 may be connected to the pixel circuit PXC and/or the first power line PL1, and the third electrode ALE3 may be connected to the second power line PL2.

In an embodiment, at least some of the electrodes ALE may be electrically connected to some of the connection electrodes ELT through a contact hole CH. For example, the first electrode ALE1 may be electrically connected to the first connection electrode ELT1 through a first contact hole CH1. The second electrode ALE2 may be electrically connected to the second connection electrode ELT2 through a second contact hole CH2. The third electrode ALE3 may be electrically connected to the fifth connection electrode ELT5 through a third contact hole CH3. The fourth electrode ALE4 may be electrically connected to the fourth connection electrode ELT4 through a fourth contact hole CH4. The first to fourth contact holes CH1, CH2, CH3, and CH4 may be located in the second opening area OPA2, but the disclosure is not limited thereto.

A pair of alignment electrodes ALE adjacent to each other may be supplied with different signals at the step of aligning the light emitting elements LD. For example, in case that the first to fourth electrodes ALE1, ALE2, ALE3, and ALE4 are successively arranged in the first direction (the X-axis direction), the first and second electrodes ALE1 and ALE2 may make a pair and be supplied with different alignment signals, and the third and fourth electrodes ALE3 and ALE4 may make a pair and be supplied with different alignment signals.

In an embodiment, the second and third electrodes ALE2 and ALE3 may be supplied with an identical signal at the step of aligning the light emitting elements LD. Although FIG. 5 illustrates that the second and third electrodes ALE2 and ALE3 are separated from each other, the second and third electrodes ALE2 and ALE3 may be integrally or non-integrally connected to each other at the step of aligning the light emitting elements LD.

In an embodiment, bank patterns BNP may be disposed under the electrodes ALE. The bank patterns BNP may be provided in at least the emission area EA. The bank patterns BNP may extend in the second direction (the Y-axis direction) and be spaced apart from each other in the first direction (the X-axis direction).

Since the bank patterns BNP are provided under respective partial areas of the electrodes ALE, the respective partial areas of the electrodes ALE may protrude upward, i.e., in a third direction (a Z-axis direction), in the areas where the respective patterns BNP are formed. In case that the bank patterns BNP and/or the electrodes ALE include reflective material, a reflective wall structure may be formed around the light emitting elements LD. Hence, light emitted from the light emitting elements LD may be emitted in an upward direction of the pixel PXL (for example, in a frontal direction of the display panel DP including a selected viewing angle range), so that the light output efficiency of the display panel PNL may be improved.

The light emitting elements LD each may be aligned between a pair of electrodes ALE in the emission area EA. Furthermore, the light emitting elements LD each may be electrically connected between a pair of connection electrodes ELT.

The first light emitting element LD1 may be aligned between the first and second electrodes ALE1 and ALE2. The first light emitting element LD1 may be electrically connected between the first and second connection electrodes ELT1 and ELT2. For example, the first light emitting element LD1 may be aligned in first areas (for example, upper end areas) of the first and second electrodes ALE1 and ALE2. The first end EP1 of the first light emitting element LD1 may be electrically connected to the first connection electrode ELT1. The second end EP2 of the first light emitting element LD1 may be electrically connected to the second connection electrode ELT2.

The second light emitting element LD2 may be aligned between the first and second electrodes ALE1 and ALE2. The second light emitting element LD2 may be electrically connected between the second and third connection electrodes ELT2 and ELT3. For example, the second light emitting element LD2 may be aligned in second areas (for example, lower end areas) of the first and second electrodes ALE1 and ALE2. The first end EP1 of the second light emitting element LD2 may be electrically connected to the second connection electrode ELT2. The second end EP2 of the second light emitting element LD2 may be electrically connected to the third connection electrode ELT3.

The third light emitting element LD3 may be aligned between the third and fourth electrodes ALE3 and ALE4. The third light emitting element LD3 may be electrically connected between the third and fourth connection electrodes ELT3 and ELT4. For example, the third light emitting element LD3 may be aligned in second areas (for example, lower end areas) of the third and fourth electrodes ALE3 and ALE4. The first end EP1 of the third light emitting element LD3 may be electrically connected to the third connection electrode ELT3. The second end EP2 of the third light emitting element LD3 may be electrically connected to the fourth connection electrode ELT4.

The fourth light emitting element LD4 may be aligned between the third and fourth electrodes ALE3 and ALE4. The fourth light emitting element LD4 may be electrically connected between the fourth and fifth connection electrodes ELT4 and ELT5. For example, the fourth light emitting element LD4 may be aligned in first areas (for example, the upper end areas) of the third and fourth electrodes ALE3 and ALE4. The first end EP1 of the fourth light emitting element LD4 may be electrically connected to the fourth connection electrode ELT4. The second end EP2 of the fourth light emitting element LD4 may be electrically connected to the fifth connection electrode ELT5.

For example, the first light emitting element LD1 may be disposed in a left upper end area of the emission area EA. The second light emitting element LD2 may be disposed in a left lower end area of the emission area EA. The third light emitting element LD3 may be disposed in a right lower end area of the emission area EA. The fourth light emitting element LD4 may be disposed in a right upper end area of the emission area EA. Here, the arrangement and/or connection structure of the light emitting elements LD may be changed depending on the structure of the emission circuit EMU and/or the number of serial stages.

The connection electrodes ELT each may be provided in at least the emission area EA, and be disposed to overlap at least one electrode ALE and/or light emitting element LD. For example, the connection electrodes ELT may be provided on the electrodes ALE and/or the light emitting elements LD in such a way that each of the connection electrodes ELT overlaps the corresponding electrodes ALE and/or the corresponding light emitting elements LD, whereby the connection electrodes ELT may be electrically connected to the light emitting elements LD.

The first connection electrode ELT1 may be disposed on the first area (for example, the upper end area) of the first electrode ALE1 and the first ends EP1 of the first light emitting elements LD1, and thus electrically connected to the first ends EP1 of the first light emitting elements LD1.

The second connection electrode ELT2 may be disposed on the first area (for example, the upper end area) of the second electrode ALE2 and the second ends EP2 of the first light emitting elements LD1, and thus electrically connected to the second ends EP2 of the first light emitting elements LD1. Furthermore, the second connection electrode ELT2 may be disposed on the second area (for example, the lower end area) of the first electrode ALE1 and the first ends EP1 of the second light emitting elements LD2, and thus electrically connected to the first ends EP1 of the second light emitting elements LD2. For example, the second connection electrode ELT2 may electrically connect the second ends EP2 of the first light emitting elements LD1 and the first ends EP1 of the second light emitting elements LD2 to each other in the emission area EA. To this end, the second connection electrode ELT2 may have a curved shape. For example, the second connection electrode ELT2 may have a bent or curved structure on a boundary between an area where at least one first light emitting element LD1 is disposed and an area where at least one second light emitting element LD2 is disposed.

The third connection electrode ELT3 may be disposed on the second area (for example, the lower end area) of the second electrode ALE2 and the second ends EP2 of the second light emitting elements LD2, and thus electrically connected to the second ends EP2 of the second light emitting elements LD2. Furthermore, the third connection electrode ELT3 may be disposed on the second area (for example, the lower end area) of the fourth electrode ALE4 and the first ends EP1 of the third light emitting elements LD3, and thus electrically connected to the first ends EP1 of the third light emitting elements LD3. For example, the third connection electrode ELT3 may electrically connect the second ends EP2 of the second light emitting elements LD2 and the first ends EP1 of the third light emitting elements LD3 to each other in the emission area EA. To this end, the third connection electrode ELT3 may have a curved shape. For example, the third connection electrode ELT3 may have a bent or curved structure on a boundary between an area where at least one second light emitting element LD2 is disposed and an area where at least one third light emitting element LD3 is disposed.

The fourth connection electrode ELT4 may be disposed on the second area (for example, the lower end area) of the third electrode ALE3 and the second ends EP2 of the third light emitting elements LD3, and thus electrically connected to the second ends EP2 of the third light emitting elements LD3. Furthermore, the fourth connection electrode ELT4 may be disposed on the first area (for example, the upper end area) of the fourth electrode ALE4 and the first ends EP1 of the fourth light emitting elements LD4, and thus electrically connected to the first ends EP1 of the fourth light emitting elements LD4. For example, the fourth connection electrode ELT4 may electrically connect the second ends EP2 of the third light emitting elements LD3 and the first ends EP1 of the fourth light emitting elements LD4 to each other in the emission area EA. To this end, the fourth connection electrode ELT4 may have a curved shape. For example, the fourth connection electrode ELT4 may have a bent or curved structure on a boundary between an area where at least one third light emitting element LD3 is disposed and an area where at least one fourth light emitting element LD4 is disposed.

The fifth connection electrode ELT5 may be disposed on the first area (for example, the upper end area) of the third electrode ALE3 and the second ends EP2 of the fourth light emitting elements LD4, and thus electrically connected to the second ends EP2 of the fourth light emitting elements LD4.

The light emitting elements LD aligned between the electrodes ALE may be electrically connected in a desired form by using the connection electrodes ELT. For example, the first light emitting elements LD1, the second light emitting elements LD2, the third light emitting elements LD3, and the fourth light emitting elements LD4 may be electrically connected successively in series by using the connection electrodes ELT.

Hereinafter, a sectional structure of each pixel PXL will be described in detail based on the light emitting element LD, with reference to FIGS. 6 and 7. FIGS. 6 and 7 illustrate a pixel circuit layer PCL and a light emitting element layer LEL of the pixel PXL. FIG. 7 illustrates a first transistor M1 of circuit elements that form the pixel circuit (refer to PXC of FIG. 4). In case that there is no need to separately designate the first to third transistors M1, M2, and M3, the term "transistor M" will be comprehensively used. The structures of the transistors M and/or positions in layers thereof are not limited to those of the embodiment shown in FIG. 7 and may be changed depending on embodiments.

Referring to FIGS. 6 and 7, the pixel circuit layer PCL and the light emitting element layer LEL for the pixels PXL in accordance with an embodiment may include circuit elements including transistors M disposed on the base layer BSL, and lines electrically connected to the circuit elements. The light emitting element layer LEL including the electrodes ALE, the light emitting elements LD, and/or the connection electrodes ELT may be disposed on the pixel circuit layer PCL.

The base layer BSL may be a rigid or flexible substrate or film. For example, the base layer BSL may be a rigid substrate made of glass or reinforced glass, a flexible substrate (or a thin film) formed of plastic or metal, or at least one insulating layer. The material and/or properties of the base layer BSL is not particularly limited. In an embodiment, the base layer BSL may be substantially transparent. Here, the words "substantially transparent" may mean that light can pass through the substrate SUB at a selected transmissivity or higher. In an embodiment, the base layer BSL may be translucent or opaque. Furthermore, the base layer BSL may include reflective material in some embodiments.

The bottom conductive layer BML and a first power conductive layer PL2a may be disposed on the base layer BSL. The bottom conductive layer BML and the first power conductive layer PL2a may be disposed on the same layer. For example, the bottom conductive layer BML and the first power conductive layer PL2a may be simultaneously formed through the same process, but the disclosure is not limited thereto. The first power conductive layer PL2a may form the second power line PL2 described with reference to FIG. 4.

The bottom conductive layer BML and the first power conductive layer PL2a each may have a single layer or multilayer structure formed of molybdenum (Mo), copper (Cu), aluminum (Al), chrome (Cr), gold (Au), titanium (Ti), nickel (Ni), neodymium (Nd), indium (In), tin (Sn), and an oxide or alloy thereof.

A buffer layer BFL may be disposed on the bottom conductive layer BML and the first power conductive layer PL2a. The buffer layer BFL may prevent impurities from diffusing into the circuit elements. The buffer layer BFL may be formed of a single layer, or may be formed of multiple layers having at least two or more layers. In case that the buffer layer BFL has a multilayer structure, the respective layers may be formed of the same material or different materials.

A semiconductor pattern SCP may be disposed on the buffer layer BFL. For example, each semiconductor pattern SCP may include a first area which electrically contacts a first transistor electrode TE1, a second area which electrically contacts a second transistor electrode TE2, and a channel area disposed between the first and second areas. In an embodiment, one of the first and second areas may be a source area, and the other may be a drain area.

In an embodiment, the semiconductor pattern SCP may be formed of polysilicon, amorphous silicon, an oxide semiconductor, etc. The channel area of the semiconductor pattern SCP may be an intrinsic semiconductor, which is an undoped semiconductor pattern. Each of the first and second areas of the semiconductor pattern SCP may be a semiconductor doped with an impurity.

A gate insulating layer GI may be disposed on the buffer layer BFL and the semiconductor pattern SCP. For example, the gate insulating layer GI may be disposed between the semiconductor pattern SCP and a gate electrode GE. Furthermore, the gate insulating layer GI may be disposed between the buffer layer BFL and a second power conductive layer PL2b. The gate insulating layer GI may be formed of a single layer or multiple layers, and include inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The gate electrode GE of the transistor M and the second power conductive layer PL2b may be disposed on the gate insulating layer GI. The gate electrode GE and the second power conductive layer PL2b may be disposed on the same layer. For example, the gate electrode GE and the second power conductive layer PL2b may be simultaneously formed through the same process, but the disclosure is not limited thereto. The gate electrode GE may be disposed on the gate insulating layer GI to overlap the semiconductor pattern SCP in the third direction DR3 (the Z-axis direction).

The second power conductive layer PL2b may be disposed on the gate insulating layer GI to overlap the first power conductive layer PL2a in the third direction DR3 (the Z-axis direction). The second power conductive layer PL2b along with the first power conductive layer PL2a may form the second power line PL2 described with reference to FIG. 4, etc.

The gate electrode GE and the second power conductive layer PL2b each may have a single layer or multilayer structure formed of molybdenum (Mo), copper (Cu), aluminum (Al), chrome (Cr), gold (Au), titanium (Ti), nickel (Ni), neodymium (Nd), indium (In), tin (Sn), and an oxide or alloy thereof.

An interlayer insulating layer ILD may be disposed on the gate electrode GE and the second power conductive layer PL2b. For example, the interlayer insulating layer ILD may be disposed between the gate electrode GE and the first and second transistor electrodes TE1 and TE2. Furthermore, the interlayer insulating layer ILD may be disposed between the second power conductive layer PL2b and a third power conductive layer PL2c.

The interlayer insulating layer ILD may be formed of a single layer or multiple layers, and include inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The first and second transistor electrodes TE1 and TE2 of the transistor M and the third power conductive layer PL2c may be disposed on the interlayer insulating layer ILD. The first and second transistor electrodes TE1 and TE2 and the third power conductive layer PL2c may be formed of the same layer. For example, the first and second transistor electrodes TE1 and TE2 and the third power conductive layer PL2c may be simultaneously formed through the same process, but the disclosure is not limited thereto.

The first and second transistor electrodes TE1 and TE2 may be disposed to overlap the semiconductor pattern SCP in the third direction DR3 (the Z-axis direction). The first and second transistor electrodes TE1 and TE2 may be electrically connected to the semiconductor pattern SCP. For example, the first transistor electrode TE1 may be electrically connected with the first area of the semiconductor pattern SCP through a contact hole passing through the interlayer insulating layer ILD. Furthermore, the first transistor electrode TE1 may be electrically connected with the bottom conductive layer BML through a contact hole passing through the interlayer insulating layer ILD and the buffer layer BFL. The second transistor electrode TE2 may be electrically connected with the second area of the semiconductor pattern SCP through a contact hole passing through the interlayer insulating layer ILD. In an embodiment, any of the first and second transistor electrodes TE1 and TE2 may be a source electrode, and the other one may be a drain electrode.

The third power conductive layer PL2c may be disposed to overlap the first power conductive layer PL2a and/or the second power conductive layer PL2b in the third direction (the Z-axis direction). The third power conductive layer PL2c may be electrically connected to the first power conductive layer PL2a and/or the second power conductive layer PL2b. For example, the third power conductive layer PL2c may be electrically connected with the first power conductive layer PL2a through a contact hole passing through the interlayer insulating layer ILD and the buffer layer BFL. Furthermore, the third power conductive layer PL2c may be electrically connected with the second power conductive layer PL2b through a contact hole passing through the interlayer insulating layer ILD. The third power conductive layer PL2c along with the first power conductive layer PL2a and/or the second power conductive layer PL2b may form the second power line PL2 described with reference to FIG. 4, etc.

The first and second transistor electrodes TE1 and TE2 and the third power conductive layer PL2c each may have a single layer or multilayer structure formed of molybdenum (Mo), copper (Cu), aluminum (Al), chrome (Cr), gold (Au), titanium (Ti), nickel (Ni), neodymium (Nd), indium (In), tin (Sn), and an oxide or alloy thereof.

A passivation layer PSV may be disposed on the first and second transistor electrodes TE1 and TE2 and the third power conductive layer PL2c. The passivation layer PSV may be formed of a single layer or multiple layers, and include inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

A via layer VIA may be disposed on the passivation layer PSV. The via layer VIA may be formed of organic material for planarizing a stepped structure provided therebelow. For example, the via layer VIA may include organic material such as acrylic resin, epoxy resin, phenolic resin, polyamide resin, polyimide resin, polyester resin, polyphenylene sulfide resin, or benzocyclobutene (BCB). However, the disclosure is not limited thereto. The via layer VIA may include inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$).

Bank patterns BNP of the light emitting element layer LEL may be disposed on the via layer VIA of the pixel circuit layer PCL. Depending on embodiments, the bank patterns BNP may have various shapes. In an embodiment, the bank patterns BNP may have a shape protruding from the base layer BSL in the third direction (the Z-axis direction). Furthermore, the bank patterns BNP may have an inclined surface which is inclined at an angle with respect to the base layer BSL. However, the disclosure is not limited thereto. The bank patterns BNP may have a sidewall having a curved or stepped shape. For example, the bank patterns BNP each may have a cross-sectional shape such as a semi-circular or semi-elliptical shape.

The electrodes and the insulating layers that are disposed over the bank patterns BNP may have shapes corresponding to those of the bank patterns BNP. For example, the electrodes ALE that are disposed on the bank patterns BNP may include inclined surfaces or curved surfaces having shapes corresponding to that of the bank patterns BNP. Hence, the bank patterns BNP along with the electrodes ALE provided thereon may function as reflectors for guiding light emitted from the light emitting elements LD in the frontal direction of the pixel PXL, i.e., in the third direction DR3 (the Z-axis direction), and thus enhancing the light output efficiency of the display panel PNL.

The bank patterns BNP may include at least one organic material and/or inorganic material. For example, the bank patterns BNP may include organic material such as acrylic resin, epoxy resin, phenolic resin, polyamide resin, polyimide resin, polyester resin, polyphenylene sulfide resin, or benzocyclobutene (BCB). However, the disclosure is not limited thereto. The bank patterns BNP may include inorganic materials including silicon oxide ($SiO_x$), silicon nitride ($SiN_x$), silicon oxynitride ($SiO_xN_y$), aluminum nitride (AlN$_x$), aluminum oxide (AlO$_x$), zirconium oxide (ZrO$_x$), hafnium oxide (HfO$_x$), or titanium oxide (TiO$_x$).

The electrodes ALE may be disposed on the via layer VIA and the bank patterns BNP. The electrodes ALE may be disposed at positions spaced apart from each other in the pixel PXL. The electrodes ALE may be disposed on the same layer. For example, the electrodes ALE may be simultaneously formed through the same process, but the disclosure is not limited thereto.

The electrodes ALE may be supplied with alignment signals at the step of aligning the light emitting elements LD. Therefore, an electric field may be formed between the electrodes ALE, so that the light emitting elements LD that are provided in each of the pixels PXL may be aligned between the electrodes ALE.

The electrode ALE may include at least one conductive material. For example, the electrodes ALE may include at least one of a metal material, including silver (Ag), magnesium (Mg), aluminum (Al), platinum (Pt), palladium (Pd), gold (Au), nickel (Ni), neodymium (Nd), iridium (Ir), chrome (Cr), titanium (Ti), molybdenum (Mo), copper (Cu), etc., or an alloy thereof, a conductive oxide such as indium tin oxide (ITO), indium zinc oxide (IZO), indium tin zinc oxide (ITZO), aluminum zinc oxide (AZO), gallium zinc oxide (GZO), zinc tin oxide (ZTO), or gallium tin oxide (GTO), and a conductive polymer such as PEDOT, but the disclosure is not limited thereto.

A first insulating layer INS1 may be disposed on the electrodes ALE. The first insulating layer INS1 may be formed of a single layer or multiple layers, and include inorganic materials including silicon oxide (SiO$_x$), silicon nitride (SiN$_x$), silicon oxynitride (SiO$_x$N$_y$), aluminum nitride (AlN$_x$), aluminum oxide (AlO$_x$), zirconium oxide (ZrO$_x$), hafnium oxide (HfO$_x$), and titanium oxide (TiO$_x$).

The bank BNK may be disposed on the first insulating layer INS1. The bank BNK may form, at the step of supplying the light emitting elements LD to each pixel PXL, a dam structure for defining an emission area to which the light emitting elements LD are to be supplied. For example, a desired kind and/or amount of light emitting element ink may be supplied to the area defined by the bank BNK.

The bank BNK may include organic material such as acrylic resin, epoxy resin, phenolic resin, polyamide resin, polyimide resin, polyester resin, polyphenylene sulfide resin, or benzocyclobutene (BCB). However, the disclosure is not limited thereto. The bank BNK may include inorganic materials such as silicon oxide (SiO$_x$), silicon nitride (SiN$_x$), silicon oxynitride (SiO$_x$N$_y$), aluminum nitride (AlN$_x$), aluminum oxide (AlO$_x$), zirconium oxide (ZrO$_x$), hafnium oxide (HfO$_x$), or titanium oxide (TiO$_x$).

In an embodiment, the bank BNK may include at least one light shielding and/or reflective material. Therefore, a light leakage between adjacent pixels PXL may be prevented from being caused. For example, the bank BNK may include at least one black matrix material and/or color filter material. For instance, the bank BNK may be formed of a black opaque pattern which can block transmission of light. In an embodiment, a reflective layer (not illustrated) or the like may be formed on a surface (for example, a sidewall) of the bank BNK to increase the light efficiency of each pixel PXL.

The light emitting elements LD may be disposed on the first insulating layer INS1. The light emitting elements LD may be disposed on the first insulating layer INS1 between the electrodes ALE. The light emitting elements LD may be prepared in a diffused form in the light emitting element ink, and then supplied to each of the pixels PXL by an inkjet printing scheme or the like. For example, the light emitting elements LD may be diffused in a volatile solvent and supplied to each of the pixels PXL. Thereafter, if alignment signals are supplied to the electrodes ALE, an electric field may be formed between the electrodes ALE so that the light emitting elements LD may be aligned between the electrodes ALE. After the light emitting elements LD have been aligned, the solvent may be removed by volatilization or other process. The light emitting elements LD may be reliably arranged between the electrodes ALE.

A second insulating layer INS2 may be disposed on the light emitting elements LD. For example, the second insulating layer INS2 may be partially provided on the light emitting elements LD so that the first and second ends EP1 and EP2 of the light emitting elements LD are exposed from the second insulating layer INS2. In case that the second insulating layer INS2 is formed on the light emitting elements LD after the alignment of the light emitting elements LD has been completed, the light emitting elements LD may be prevented from being removed from the aligned positions.

The second insulating layer INS2 may be formed of a single layer or multiple layers, and include inorganic materials such as silicon oxide (SiO$_x$), silicon nitride (SiN$_x$), silicon oxynitride (SiO$_x$N$_y$), aluminum nitride (AlN$_x$), aluminum oxide (AlO$_x$), zirconium oxide (ZrO$_x$), hafnium oxide (HfO$_x$), and titanium oxide (TiO$_x$).

The connection electrodes ELT may be disposed on the first and second ends EP1 and EP2 of the light emitting elements LD that are exposed from the second insulating layer INS2. The connection electrodes ELT may be disposed on the same layer. The connection electrodes ELT may be formed of the same conductive layer. The connection electrodes ELT may be simultaneously formed through the same process. The connection electrodes ELT may be formed by forming one conductive layer on the light emitting elements LD and then removing portions of the conductive layer that are formed on the second insulating layer INS2 such that the conductive layer is divided into the respective connection electrodes ELT. However, the disclosure is not limited thereto, and some of the connection electrodes ELT may be formed on different conductive layers.

The first connection electrode ELT1 may be directly disposed on the first ends EP1 of the first light emitting elements LD1 and contact the first ends EP1 of the first light emitting elements LD1.

Furthermore, the second connection electrode ELT2 may be directly disposed on the second ends EP2 of the first light emitting elements LD1 and contact the second ends EP2 of the first light emitting elements LD1. Furthermore, the second connection electrode ELT2 may be directly disposed on the first ends EP1 of the second light emitting elements LD2 and contact the first ends EP1 of the second light emitting elements LD2. The second connection electrode ELT2 may electrically connect the second ends EP2 of the first light emitting elements LD1 with the first ends EP1 of the second light emitting elements LD2.

Likewise, the third connection electrode ELT3 may be directly disposed on the second ends EP2 of the second light emitting elements LD2 and contact the second ends EP2 of the second light emitting elements LD2. Furthermore, the third connection electrode ELT3 may be directly disposed on the first ends EP1 of the third light emitting elements LD3 and contact the first ends EP1 of the third light emitting elements LD3. The third connection electrode ELT3 may electrically connect the second ends EP2 of the second light emitting elements LD2 with the first ends EP1 of the third light emitting elements LD3.

Likewise, the fourth connection electrode ELT4 may be directly disposed on the second ends EP2 of the third light emitting elements LD3 and contact the second ends EP2 of the third light emitting elements LD3. Furthermore, the fourth connection electrode ELT4 may be directly disposed on the first ends EP1 of the fourth light emitting elements LD4 and contact the first ends EP1 of the fourth light emitting elements LD4. The fourth connection electrode ELT4 may electrically connect the second ends EP2 of the third light emitting elements LD3 with the first ends EP1 of the fourth light emitting elements LD4.

Likewise, the fifth connection electrode ELT5 may be directly disposed on the second ends EP2 of the fourth light emitting elements LD4 and contact the second ends EP2 of the fourth light emitting elements LD4.

The connection electrodes ELT may be formed of transparent conductive materials. For example, the connection electrodes ELT may include at least one of transparent conductive materials including indium tin oxide (ITO), indium zinc oxide (IZO), indium tin zinc oxide (ITZO), aluminum zinc oxide (AZO), gallium zinc oxide (GZO), zinc tin oxide (ZTO), or gallium tin oxide (GTO), and may be substantially transparent or translucent to provide satisfactory light transmittance. Hence, light emitted from the first and second ends EP1 and EP2 of the light emitting elements LD may pass through the connection electrodes ELT and then be emitted outside the display panel PNL.

Figure 8:
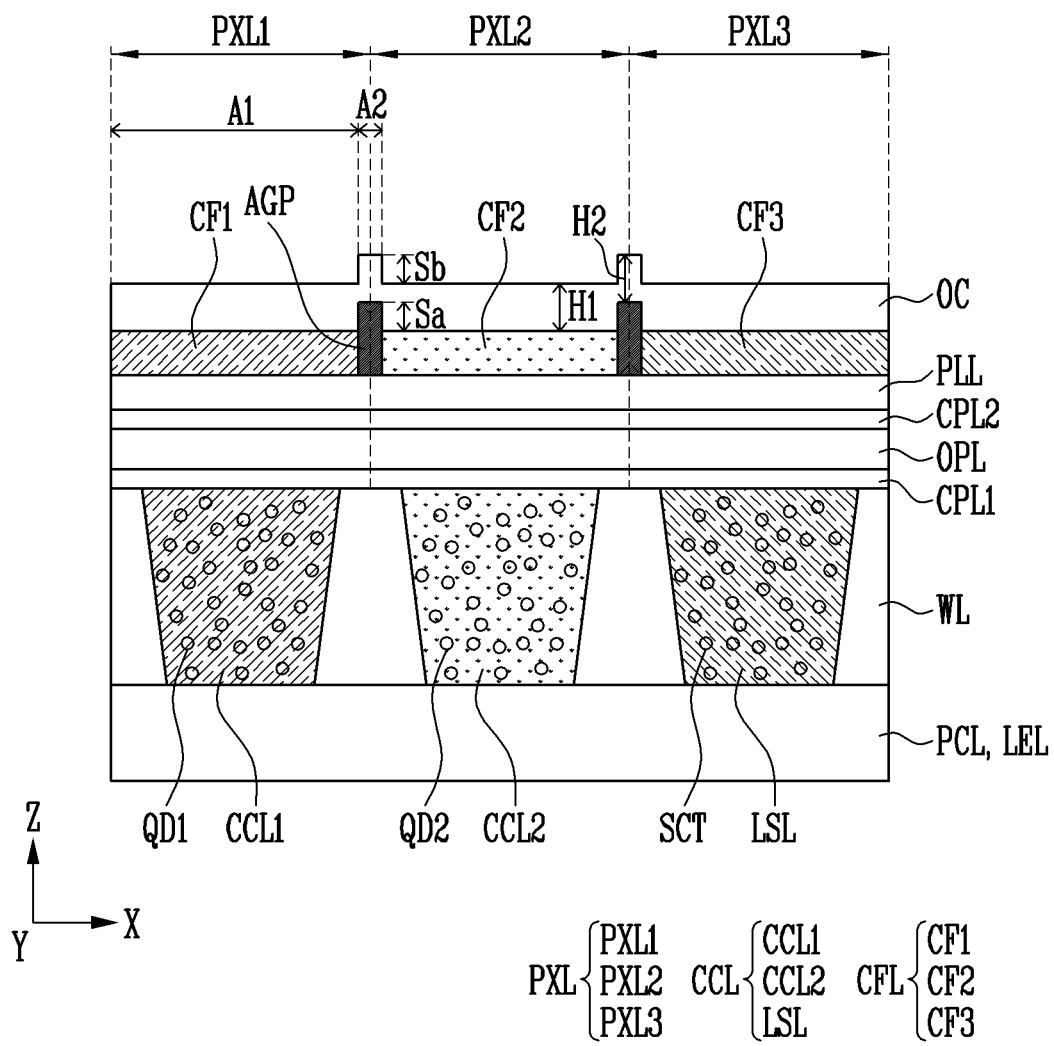
FIGS. 8 and 9 are schematic sectional views illustrating first to third pixels in accordance with an embodiment.
Figure 9:
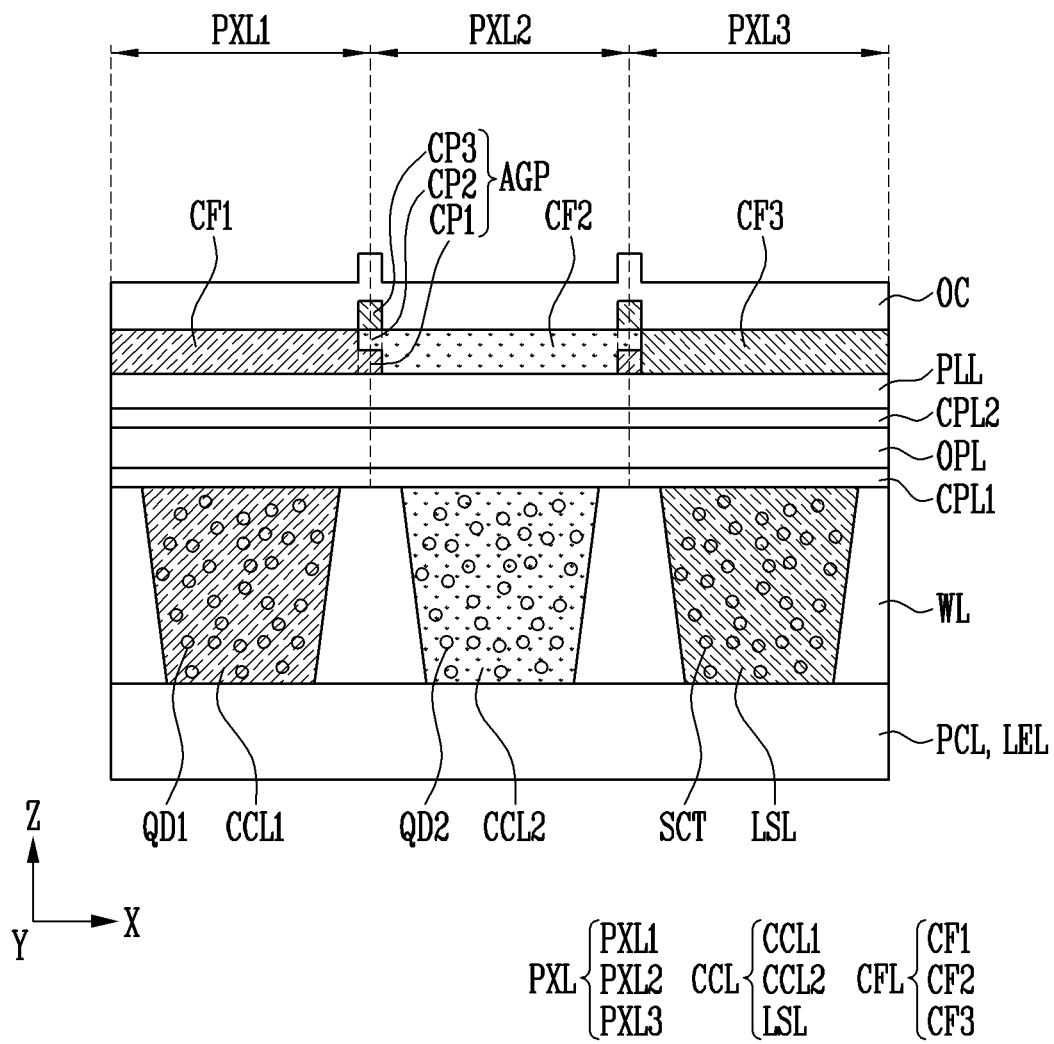

FIGS. 8 and 9 are schematic sectional views illustrating first to third pixels in accordance with an embodiment.

FIGS. 8 and 9 illustrate the partition wall WL, a color conversion layer CCL, an optical layer OPL, a color filter layer CFL, a protrusion pattern AGP, and/or an overcoat layer OC which are provided on the pixel circuit layer PCL and the light emitting element layer LEL of the pixel PXL described with reference to FIGS. 6 and 7.

Referring to FIG. 8, the partition wall WL may be disposed on the light emitting element layer LEL for the first to third pixels PXL1, PXL2, and PXL3. For example, the partition wall WL may be disposed between the first to third pixels PXL1, PXL2, and PXL3 or on boundaries therebetween, and include openings which respectively overlap the first to third pixels PXL1, PXL2, and PXL3 in a plan view. The openings of the partition wall WL may provide space in which the color conversion layer CCL can be provided.

The partition wall WL may include organic material such as acrylic resin, epoxy resin, phenolic resin, polyamide resin, polyimide resin, polyester resin, polyphenylene sulfide resin, or benzocyclobutene (BCB). However, the disclosure is not limited thereto. The partition wall WL may include inorganic materials such as silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

In an embodiment, the partition wall WL may include at least one light shielding and/or reflective material. Therefore, a light leakage between adjacent pixels PXL may be prevented from being caused. For example, the partition wall WL may include at least one black matrix material and/or color filter material. For instance, the partition wall WL may be formed of a black opaque pattern which can block transmission of light. In an embodiment, a reflective layer (not illustrated) or the like may be formed on a surface (for example, a sidewall) of the partition wall WL to increase the light efficiency of each pixel PXL.

The color conversion layer CCL may be disposed on the light emitting element layer LEL including the light emitting elements LD in the openings of the partition wall WL. The color conversion layer CCL may include a first color conversion layer CCL1 disposed in the first pixel PXL1, a second color conversion layer CCL2 disposed in the second pixel PXL2, and a light scattering layer LSL disposed in the third pixel PXL3.

In an embodiment, the first to third pixels PXL1, PXL2, and PXL3 may include light emitting elements LD that emit the same color light. In an embodiment, the first to third pixels PXL1, PXL2, and PXL3 may include light emitting elements LD that emit the third color light (for example, blue light). Since the color conversion layer CCL including color conversion particles is disposed in each of the first to third pixels PXL1, PXL2, and PXL3, a full-color image may be displayed.

The first color conversion layer CCL1 may include first color conversion particles for converting the third color of light emitted from the light emitting element LD to the first color of light. For example, the first color conversion layer CCL1 may include first quantum dots QD1 which are dispersed in a matrix material such as base resin.

In an embodiment, in case that the light emitting element LD is a blue light emitting element that emits blue light and the first pixel PXL1 is a red pixel, the first color conversion layer CCL1 may include the first quantum dots QD1 which convert blue light emitted from the blue light emitting element to red light. The first quantum dots QD1 may absorb blue light, shift the wavelength of the light according to an energy transition, and thus emit red light. In case that the first color pixel PXL1 has a different color, the first color conversion layer CCL1 may include the first quantum dots QD1 corresponding to the color of the first pixel PXL1.

The second color conversion layer CCL2 may include second color conversion particles for converting the third color of light emitted from the light emitting element LD to the second color of light. For example, the second color conversion layer CCL2 may include second quantum dots QD2 which are dispersed in a matrix material such as base resin.

In an embodiment, in case that the light emitting element LD is a blue light emitting element that emits blue light and the second pixel PXL2 is a green pixel, the second color conversion layer CCL2 may include the second quantum dots QD2 which convert blue light emitted from the blue light emitting element to green light. The second quantum dots QD2 may absorb blue light, shift the wavelength of the light according to an energy transition, and thus emit green light. In case that the second color pixel PXL2 has a different color, the second color conversion layer CCL2 may include the second quantum dots QD2 corresponding to the color of the second pixel PXL2.

In an embodiment, as blue light having a relatively short wavelength in a visible light range is incident on each of the first quantum dots QD1 and the second quantum dots QD2, absorption coefficients of the first quantum dot QD1 and the second quantum dot QD2 may be increased. Therefore, the efficiency of light emitted from the first pixel PXL1 and the second pixel PXL2 may be enhanced, and satisfactory color reproducibility may be obtained. Furthermore, since an emission circuit EMU including the first to third pixels PXL1, PXL2, and PXL3 is formed of light emitting elements LD (for example, blue light emitting elements) that emit the same color of light, the fabrication process of the display device may be more efficient.

The light scattering layer LSL may be provided to efficiently use the third color of light (for example, blue light) emitted from the light emitting element LD. For example, in case that the light emitting element LD is a blue light emitting element that emits blue light and the third pixel PXL3 is a blue pixel, the light scattering layer LSL may include at least one type of light scatter SCT to efficiently use light emitted from the light emitting element LD.

For example, the light scattering layer LSL may include light scatters SCT which are distributed in a matrix material such as base resin. For instance, the light scattering layer LSL may include light scatters SCT formed of material such as silica, but the constituent material of the light scatters SCT is not limited thereto. The light scatters SCT may not only be provided in the third pixel PXL3, but may also be selectively included in the first conversion layer CCL1 or the second color conversion layer CCL2. In an embodiment, the light scatters SCT may be omitted, and the light scattering layer LSL may be formed of transparent polymer.

A first capping layer CPL1 may be disposed on the color conversion layer CCL. The first capping layer CPL1 may be provided over the first to third pixels PXL1, PXL2, and PXL3. The first capping layer CPL1 may cover the color conversion layer CCL. The first capping layer CPL1 may prevent the color conversion layer CCL from being damaged or contaminated by permeation of external impurities such as water or air.

The first capping layer CPL1 may be an inorganic layer, and be formed of silicon nitride ($SiN_x$), aluminum nitride ($AlN_x$), titanium nitride ($TiN_x$), silicon oxide ($SiO_x$), aluminum oxide ($AlO_x$), titanium oxide ($TiO_x$), silicon oxycarbide ($SiO_xC_y$), or silicon oxynitride ($SiO_xN_y$).

The optical layer OPL may be disposed on the first capping layer CPL1. The optical layer OPL may recycle light provided from the color conversion layer CCL by total reflection and thus enhance light extraction efficiency. Hence, the optical layer OPL may have a relatively low refractive index compared to that of the color conversion layer CCL. For example, the refractive index of the color conversion layer CCL may be in a range of approximately 1.6 to approximately 2.0, and the refractive index of the optical layer OPL may be in a range of approximately 1.1 to approximately 1.3.

A second capping layer CPL2 may be disposed on the optical layer OPL. The second capping layer CPL2 may be provided over the first to third pixels PXL1, PXL2, and PXL3. The second capping layer CPL2 may cover the optical layer OPL. The second capping layer CPL2 may prevent the optical layer OPL from being damaged or contaminated by permeation of external impurities such as water or air.

The second capping layer CPL2 may be an inorganic layer, and be formed of silicon nitride ($SiN_x$), aluminum nitride ($AlN_x$), titanium nitride ($TiN_x$), silicon oxide ($SiO_x$), aluminum oxide ($AlO_x$), titanium oxide ($TiO_x$), silicon oxycarbide ($SiO_xC_y$), or silicon oxynitride ($SiO_xN_y$).

A planarization layer PLL may be disposed on the second capping layer CPL2. The planarization layer PLL may be provided over the first to third pixels PXL1, PXL2, and PXL3.

The planarization layer PLL may include organic material such as acrylic resin, epoxy resin, phenolic resin, polyamide resin, polyimide resin, polyester resin, polyphenylene sulfide resin, or benzocyclobutene (BCB). However, the disclosure is not limited thereto. The planarization layer PLL may include inorganic materials such as silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The color filter layer CFL may be disposed on the planarization layer PLL. The color filter layer CFL may include color filters CF1, CF2, and CF3 corresponding to the colors of the respective pixels PXL. Since the color filters CF1, CF2, and CF3 corresponding to the respective colors of the first to third pixels PXL1, PXL2, and PXL3 are disposed, a full-color image may be displayed.

The color filter layer CFL may include a first color filter CF1 disposed in the first pixel PXL1 and that allows light emitted from the first pixel PXL1 to selectively pass through, a second color filter CF2 disposed in the second pixel PXL2 and that allows light emitted from the second pixel PXL2 to selectively pass through, and a third color filter CF3 disposed in the third pixel PXL3 and that allows light emitted from the third pixel PXL3 to selectively pass through.

In an embodiment, the first color filter CF1, the second color filter CF2, and the third color filter CF3 may be respectively a red color filter, a green color filter, and a blue color filter, but the disclosure is not limited thereto. Hereinafter, the term "color filter CF" or "color filters CF" will be used to designate any of the first color filter CF1, the second color filter CF2, and the third color filter CF3, or comprehensively designate two or more kinds of color filters.

The first color filter CF1 may overlap the light emitting element layer LEL (or the light emitting elements LD) of the first pixel PXL1 and the first color conversion layer CCL1 in the third direction (the Z-axis direction). The first color filter CF1 may include color filter material for allowing the first color of light (or red light) to selectively pass therethrough. For example, in case that the first pixel PXL1 is a red pixel, the first color filter CF1 may include red color filter material.

The second color filter CF2 may overlap the light emitting element layer LEL (or the light emitting elements LD) of the second pixel PXL2 and the second color conversion layer CCL2 in the third direction (the Z-axis direction). The second color filter CF2 may include color filter material for allowing the second color of light (or green light) to selectively pass therethrough. For example, in case that the second pixel PXL2 is a green pixel, the second color filter CF2 may include green color filter material.

The third color filter CF3 may overlap the light emitting element layer LEL (or the light emitting elements LD) of the third pixel PXL3 and the light scattering layer LSL in the third direction (the Z-axis direction). The third color filter CF3 may include color filter material for allowing the third color of light (or blue light) to selectively pass therethrough. For example, in case that the third pixel PXL3 is a blue pixel, the third color filter CF3 may include blue color filter material.

Protrusion patterns AGP may be disposed between the first to third color filters CF1, CF2, and CF3. The protrusion patterns AGP may be disposed between the first to third pixels PXL1, PXL2, and PXL3, or on a boundary therebetween. A step difference Sa may be formed between the protrusion patterns AGP and the color filters CF. For example, a thickness of each of the protrusion patterns AGP with respect to the third direction (the Z-axis direction) may be greater than a thickness of each of the color filters CF with respect to the third direction (the Z-axis direction).

In case that the step difference Sa is formed between the protrusion patterns AGP and the color filters CF, bent portions may be formed on the surface of the display panel PNL by the protrusion patterns AGP so that external light can be scattered, whereby a glare phenomenon may be mitigated. To have antiglare characteristics in the display panel PNL, the step difference Sa between the color filters CF and the protrusion patterns AGP may be in a range of about 2 μm to about 5 μm, but the disclosure is not limited thereto.

The protrusion patterns AGP each may include a light shielding layer, as illustrated in FIG. 8. The material of the light shielding layer is not particularly limited. Light shielding materials such as black matrix material may be used to form the light shielding layer.

In another example, as illustrated in FIG. 9, the protrusion pattern AGP may include first to third color patterns CP1, CP2, and CP3. The first to third color patterns CP1, CP2, and CP3 may be stacked on each other. The first to third color patterns CP1, CP2, and CP3 that form the protrusion pattern AGP may respectively have the same materials as those of the first to third color filters CF1, CF2, and CF3. For example, the first to third color patterns CP1, CP2, and CP3 may be simultaneously formed through the same process as that of the first to third color filters CF1, CF2, and CF3, but the disclosure is not limited thereto. As such, the protrusion patterns AGP each formed of the light shielding layer or the first to third color patterns CP1, CP2, and CP3 that are stacked on each other are formed between the first to third color filters CF1, CF2, and CF3, color mixing defects, which may be visible from the front surface or the side surface of the display device, may be prevented from occurring.

The overcoat layer OC may be disposed on the color filter layer CFL and the protrusion pattern AGP. The overcoat layer OC may be provided over the first to third pixels PXL1, PXL2, and PXL3. The overcoat layer OC may cover the color filter layer CFL and the protrusion pattern AGP. The overcoat layer OC may be directly formed on the color filter layer CFL and the protrusion patter AGP, but the disclosure is not limited thereto.

The overcoat layer OC may be formed with a uniform thickness on the color filter layer CFL and/or the protrusion pattern AGP. The overcoat layer OC may be formed with a uniform thickness in a shape corresponding to the step difference Sa between the color filter layer CFL and the protrusion pattern AGP. For example, the overcoat layer OC may include a first area A1 over each of the first to third color filters CF1, CF2, and CF3, and a second area A2 over each of the protrusion patterns AGP. A thickness H1 of the first area A1 with respect to the third direction (the Z-axis direction) may be substantially the same as a thickness H2 of the second area A2 with respect to the third direction (the Z-axis direction). For example, the thickness H1 of the first area A1 of the overcoat layer OC with respect to the third direction (the Z-axis direction) and the thickness H2 of the second area A2 with respect to the third direction (the Z-axis direction) may be about 10 μm or less, but the disclosure is not limited thereto.

In case that the overcoat layer OC is formed with a uniform thickness in a shape corresponding to the step difference Sa between the color filter layer CFL and the protrusion pattern AGP, a step difference Sb may be formed between the first area A1 and the second area A2. As such, in case that the first area A1 and the second area A2 of the overcoat layer OC form the step difference Sb, bent portions may be formed on the surface of the display panel PNL so that external light may be scattered, and glare from the display may be reduced. Therefore, a separate antiglare film, which must be attached to the display panel PNL, may be omitted, simplifying the fabricating process, and reducing production costs. To have antiglare characteristics in the display panel PNL, the step difference Sb between the first area A1 and the second area A2 may be in a range of about 2 μm to about 5 μm, but the disclosure is not limited thereto. Furthermore, the step difference Sb between the first area A1 and the second area A2 may be substantially the same as the step difference Sa between the color filter layer CFL and the protrusion pattern AGP, but the disclosure is not limited thereto.

To form the overcoat layer OC with a uniform thickness in a shape corresponding to the step difference Sa between the color filter layer CFL and the protrusion pattern AGP, the overcoat layer OC may include a polyhedral oligomeric silsesquioxane (POSS) compound. For example, the overcoat layer OC may be fabricated by hardening a composite including a polysiloxane compound having the following chemical formula A, B, or C or a combination thereof.

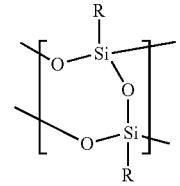

<Chemical Formula A>

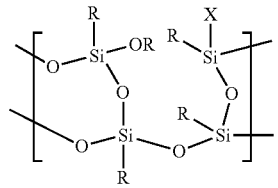

<Chemical Formula B>

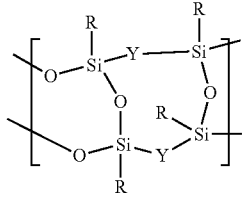

<Chemical Formula C>

In an embodiment, the polysiloxane compound may include at least two of the chemical formulas A, B, and C. For example, the polysiloxane compound may be represented by the following chemical formulas 1 to 7.

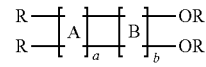

<Chemical Formula 1>

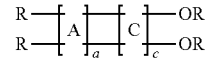

<Chemical Formula 2>

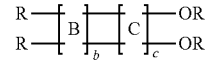

<Chemical Formula 3>

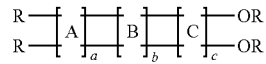

<Chemical Formula 4>

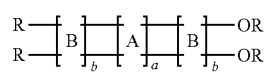

<Chemical Formula 5>

<Chemical Formula 6>

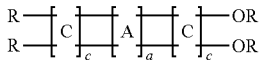

<Chemical Formula 7>

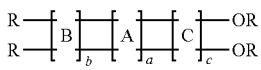

In the chemical formulas, each X may independently indicate R or $[(SiO_{3/2}R)_{4+2n}O]$. Each Y may independently indicate O, NR, or $[(SiO_{3/2}R)_{4+2n}O]$. Each R may independently indicate hydrogen, heavy hydrogen, halogen, an amine group, an epoxy group, a cyclohexyl epoxy group, an acrylic group, a methacrylic group, a thiol group, an isocyanate group, a nitrile group, a nitro group, a phenyl group (substituted with or not substituted with hydrogen, heavy hydrogen, halogen, an amine group, an epoxy group, a cyclohexyl epoxy group, an acrylic group, a methacrylic group, a thiol group, an isocyanate group, a nitrile group, a nitro group), a $C_1$ to $C_{12}$ alkyl group, a $C_2$ to $C_{12}$ alkenyl group, a $C_1$ to $C_{40}$ alkoxy group, a $C_3$ to $C_{12}$ cycloalkyl group, a $C_3$ to $C_{12}$ heterocycloalkyl group, a $C_6$ to $C_{12}$ aryl group, a $C_3$ to $C_{12}$ heteroaryl group, a $C_3$ to $C_{12}$ aralkyl group, a $C_3$ to $C_{12}$ aryloxy group, or a $C_3$ to $C_{12}$ arycyol group. Furthermore, a, b, and c may each be an integer, independently ranging from 1 to 100.

Hereinafter, a method of fabricating the display device in accordance with an embodiment will be described.

FIGS. 10 to 16 are schematic sectional views illustrating, by process steps, a method of fabricating the display device in accordance with an embodiment. FIGS. 10 to 16 are sectional views for describing the fabricating method, based on the display device illustrated in FIG. 8. Like references will be used to designate substantially the same components as those of the embodiment of FIG. 8, and detailed explanations of the same components will be omitted.

Figure 10:
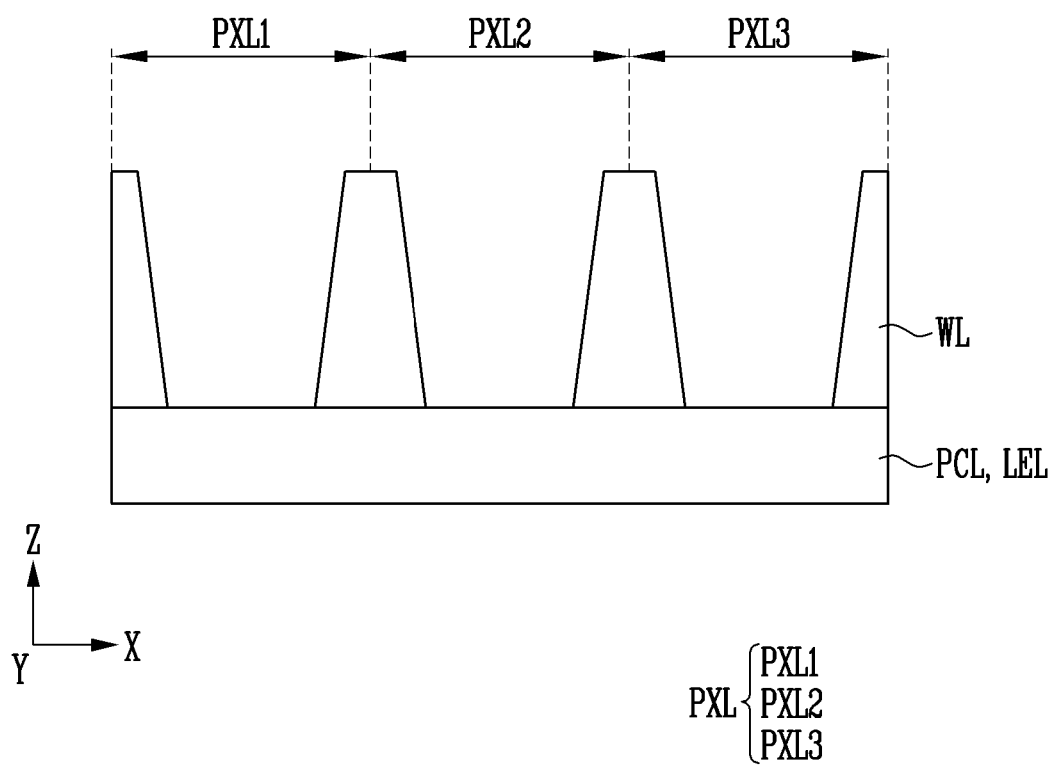
FIGS. 10 to 16 are schematic sectional views illustrating, by process steps, a method of fabricating a display device in accordance with an embodiment.

Referring to FIG. 10, the partition wall WL may be formed on the pixel circuit layer PCL and the light emitting element layer LEL. The partition wall WL may be disposed between the first to third pixels PXL1, PXL2, and PXL3 or on boundaries therebetween, and include openings which respectively overlap the first to third pixels PXL1, PXL2, and PXL3. The openings of the partition wall WL may overlap the light emitting element LEL described with reference to FIGS. 6 and 7. For example, the openings of the partition wall WL may overlap the light emitting elements LD that are aligned between the electrodes ALE formed on the base layer BSL at positions spaced apart from each other. The openings of the partition wall WL may provide space in which the color conversion layer CCL can be provided during a subsequent process.

Figure 11:
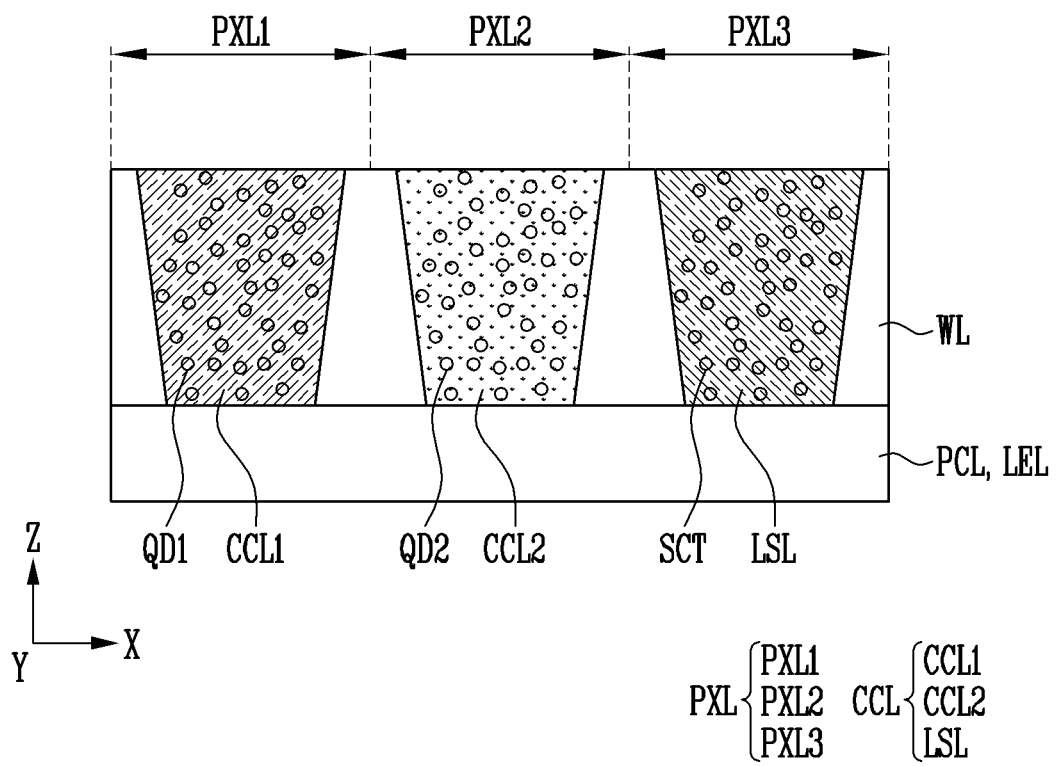

Referring to FIG. 11, the color conversion layer CCL may be formed in the openings of the partition wall WL. The color conversion layer CCL may be provided on the light emitting element layer LEL including the light emitting elements LD in the openings of the partition wall WL. The first color conversion layer CCL1 may be provided in the first pixel PXL1. The second color conversion layer CCL2 may be provided in the second pixel PXL2. The light scattering layer LSL may be provided in the third pixel PXL3.

In an embodiment, in case that the light emitting element LD is a blue light emitting element that emits blue light and the first pixel PXL1 is a red pixel, the first color conversion layer CCL1 may include the first quantum dots QD1 which convert blue light emitted from the blue light emitting element to red light. The first quantum dots QD1 may absorb blue light, shift the wavelength of the light according to an energy transition, and thus emit red light. In case that the first color pixel PXL1 has a different color, the first color conversion layer CCL1 may include the first quantum dots QD1 corresponding to the color of the first pixel PXL1.

In an embodiment, in case that the light emitting element LD is a blue light emitting element that emits blue light and the second pixel PXL2 is a green pixel, the second color conversion layer CCL2 may include the second quantum dots QD2 which convert blue light emitted from the blue light emitting element to green light. The second quantum dots QD2 may absorb blue light, shift the wavelength thereof according to an energy transition, and thus emit green light. In case that the second color pixel PXL2 has a different color, the second color conversion layer CCL2 may include the second quantum dots QD2 corresponding to the color of the second pixel PXL2.

In an embodiment, as blue light having a relatively short wavelength in a visible light range is incident on each of the first quantum dots QD1 and the second quantum dots QD2, absorption coefficients of the first quantum dot QD1 and the second quantum dot QD2 may be increased. Therefore, eventually, the efficiency of light emitted from the first pixel PXL1 and the second pixel PXL2 may be enhanced, and satisfactory color reproducibility may be obtained. Furthermore, as described above, since the emission circuit EMU including the first to third pixels PXL1, PXL2, and PXL3 is formed of light emitting elements LD (for example, blue light emitting elements) that emit the same color of light, the fabrication process of the display device may become more efficient.

The light scattering layer LSL may be provided to efficiently use the third color of light (for example, blue light) emitted from the light emitting element LD. For example, in case that the light emitting element LD is a blue light emitting element that emits blue light and the third pixel PXL3 is a blue pixel, the light scattering layer LSL may include at least one type of light scatter SCT to efficiently use light emitted from the light emitting element LD.

For example, the light scattering layer LSL may include light scatters SCT which are dispersed in a matrix material such as base resin. For example, the light scattering layer LSL may include a light scatter SCT formed of material such as silica, but the constituent material of the light scatter SCT is not limited thereto. The light scatters SCT may not only be provided in the third pixel PXL3, but may also be selectively included in the first conversion layer CCL1 or the second color conversion layer CCL2. In an embodiment, the light scatters SCT may be omitted, and the light scattering layer LSL may be formed of a transparent polymer.

Figure 12:
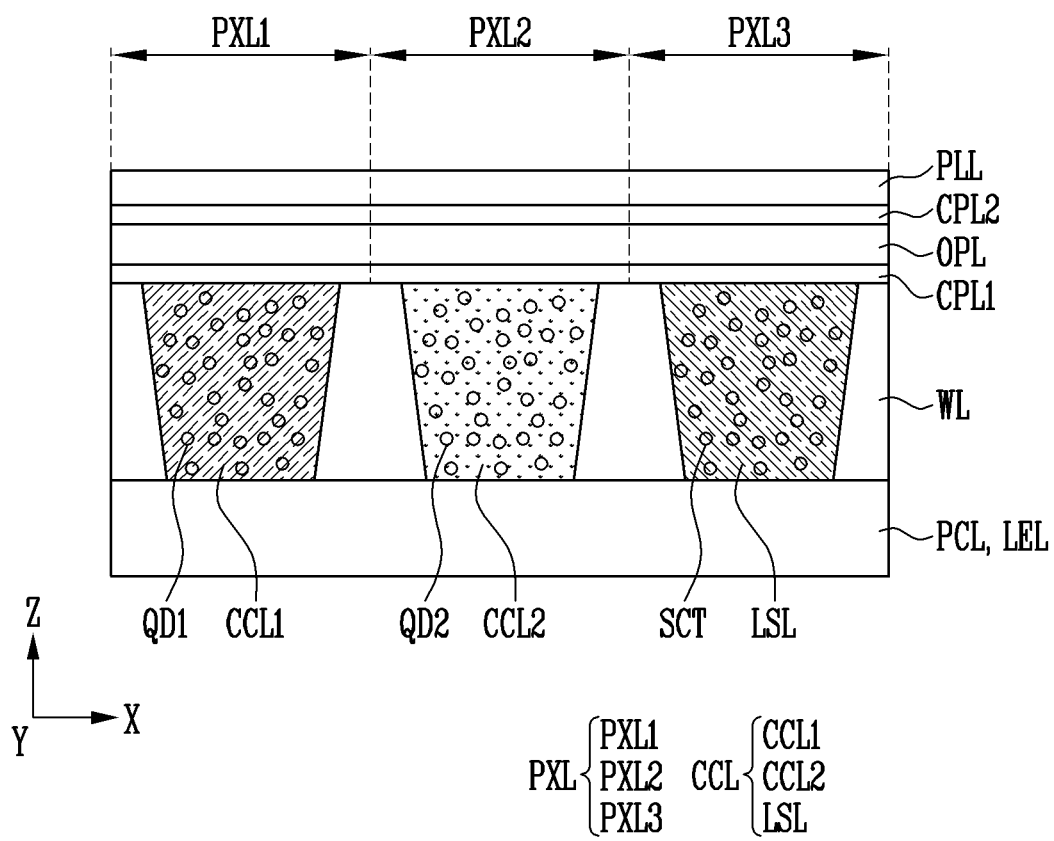

Referring to FIG. 12, subsequently, the first capping layer CPL1, the optical layer OPL, the second capping layer CPL2, and/or the planarization layer PLL may be formed on the color conversion layer CCL.

The first capping layer CPL1 may be provided over the first to third pixels PXL1, PXL2, and PXL3. The first capping layer CPL1 may cover the color conversion layer CCL. As described above, the first capping layer CPL1 may prevent the color conversion layer CCL from being damaged or contaminated by permeation of external impurities such as water or air.

The optical layer OPL may be provided over the first to third pixels PXL1, PXL2, and PXL3. However, the disclosure is not limited thereto. In an embodiment, optical layers OPL may be respectively formed in the first to third pixels PXL1, PXL2, and PXL3 and separated from each other by the partition walls WL.

The second capping layer CPL2 may be provided over the first to third pixels PXL1, PXL2, and PXL3. The second capping layer CPL2 may cover the optical layer OPL. As described above, the second capping layer CPL2 may prevent the optical layer OPL from being damaged or contaminated by permeation of external impurities such as water or air.

The planarization layer PLL may be provided over the first to third pixels PXL1, PXL2, and PXL3. The planarization layer PLL may be formed of organic material to planarize a step difference between components provided thereunder, but the disclosure is not limited thereto.

Figure 13:
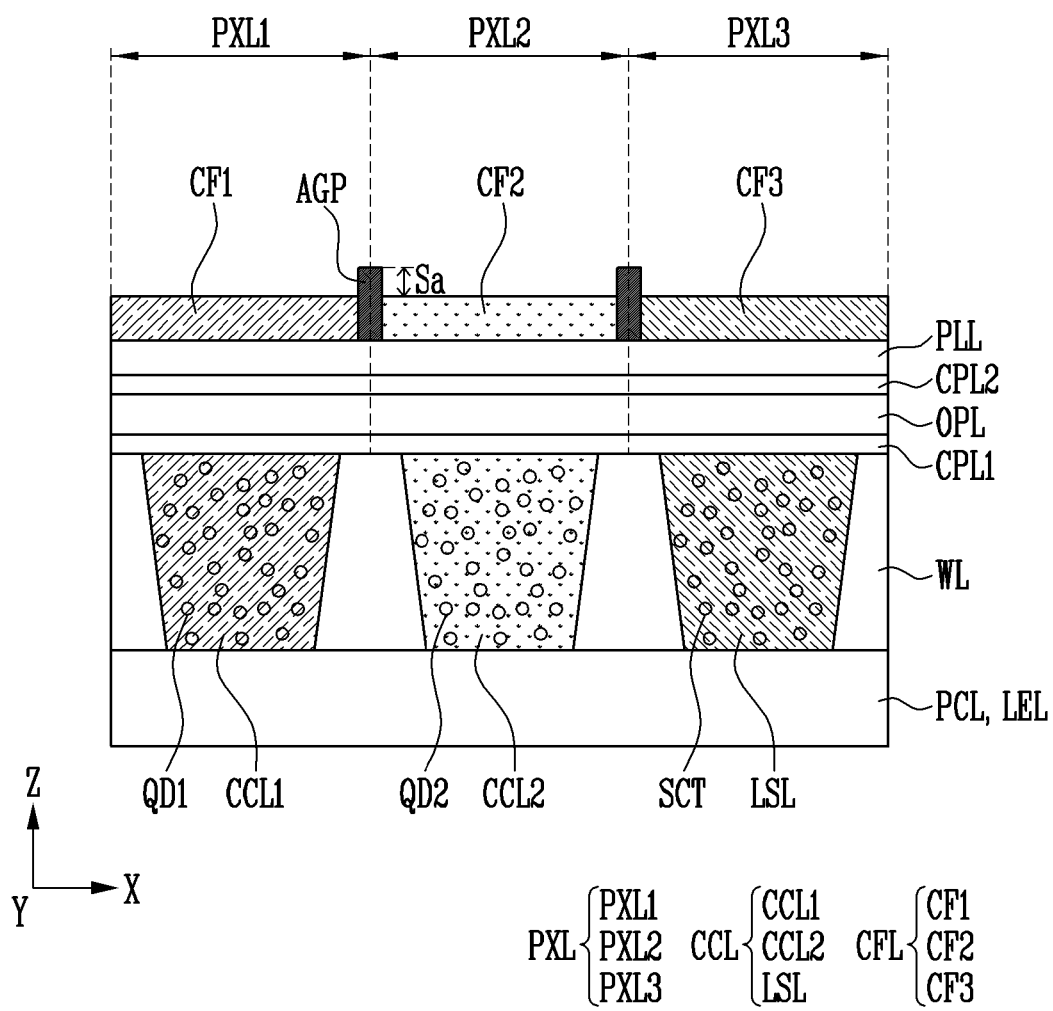
Figure 14:
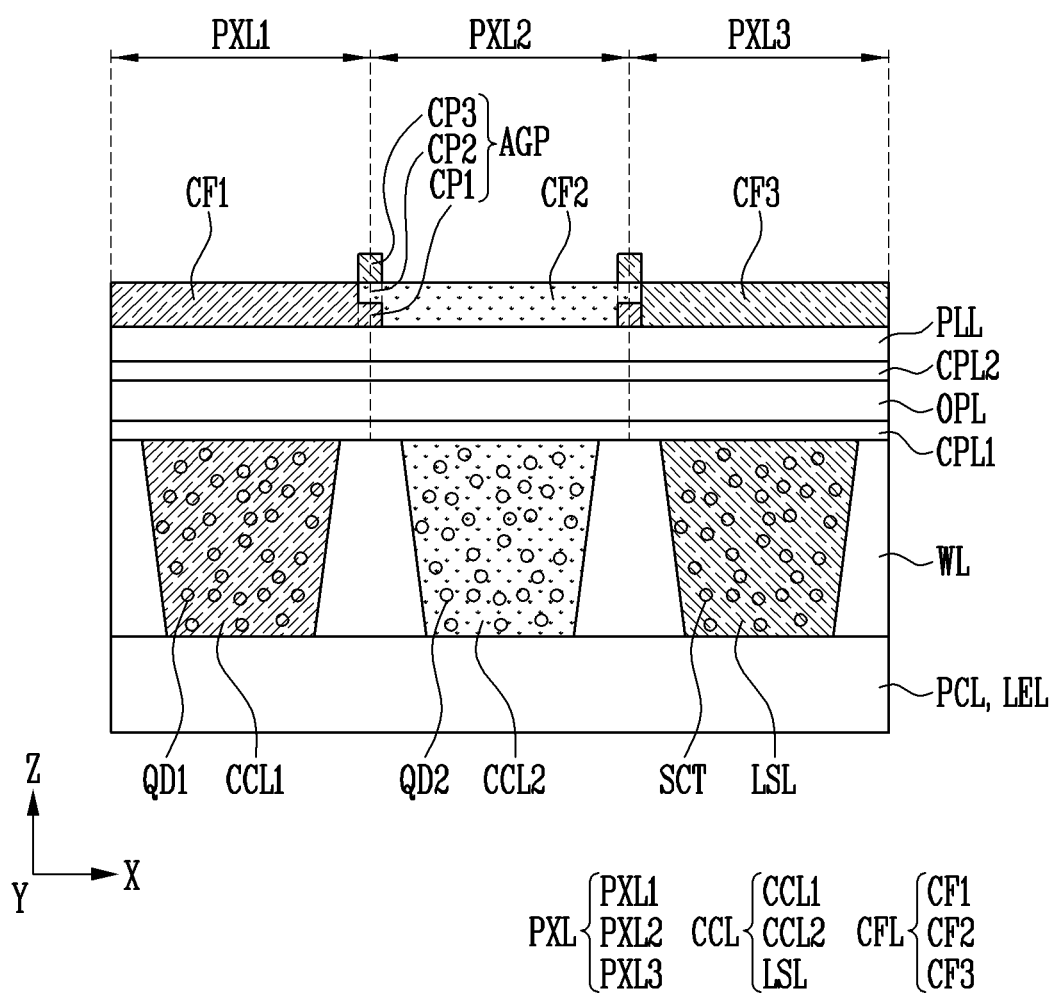

Referring to FIGS. 13 and 14, the color filter layer CFL and/or protrusion patterns AGP may be thereafter formed. The color filter layer CFL may include first to third color filters CF1, CF2, and CF3 which respectively overlap the first to third pixels PXL1, PXL2, and PXL3 in a plan view.

The protrusion patterns AGP may be respectively disposed between the first to third color filters CF1, CF2, and CF3. The protrusion patterns AGP may be formed between the first to third pixels PXL1, PXL2, and PXL3, or on a boundary therebetween. A step difference Sa may be formed between the protrusion patterns AGP and the color filters CF. In case that the step difference Sa is formed between the protrusion patterns AGP and the color filters CF, bent portions may be formed on the surface of the display panel PNL by the protrusion patterns AGP so that external light can be scattered, mitigating glare from the display panel PNL. To have antiglare characteristics in the display panel PNL, the step difference Sa between the color filters CF and the protrusion patterns AGP may be in a range of about 2 μm to about 5 μm, but the disclosure is not limited thereto.

The protrusion patterns AGP each may include a light shielding layer, as illustrated in FIG. 13. The material of the light shielding layer is not particularly limited. Light shielding materials such as black matrix material may be used to form the light shielding layer.

In another example, as illustrated in FIG. 14, the protrusion pattern AGP may include first to third color patterns CP1, CP2, and CP3. The first to third color patterns CP1, CP2, and CP3 may be stacked on each other. The first to third color patterns CP1, CP2, and CP3 that form the protrusion pattern AGP may be respectively formed of the same materials as those of the first to third color filters CF1, CF2, and CF3. For example, the first to third color patterns CP1, CP2, and CP3 may be simultaneously formed through the same process as that of the first to third color filters CF1, CF2, and CF3, but the disclosure is not limited thereto. As described above, the protrusion patterns AGP each formed of the light shielding layer or the first to third color patterns CP1, CP2, and CP3 that are stacked on each other are formed between the first to third color filters CF1, CF2, and CF3, color mixing defects, which may be visible from the front surface or side surface of the display device, may be prevented from occurring.

Figure 15:
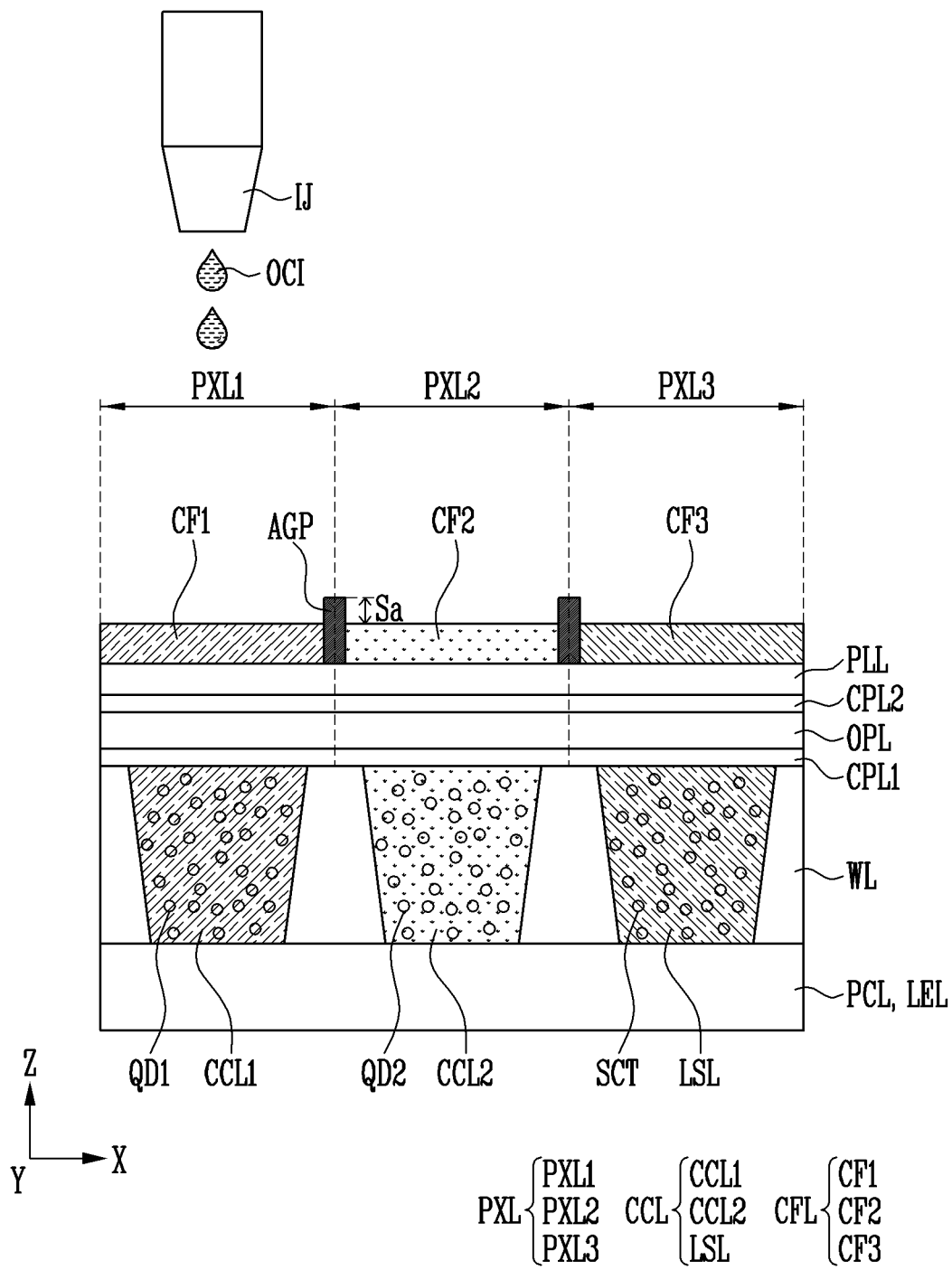
Figure 16:
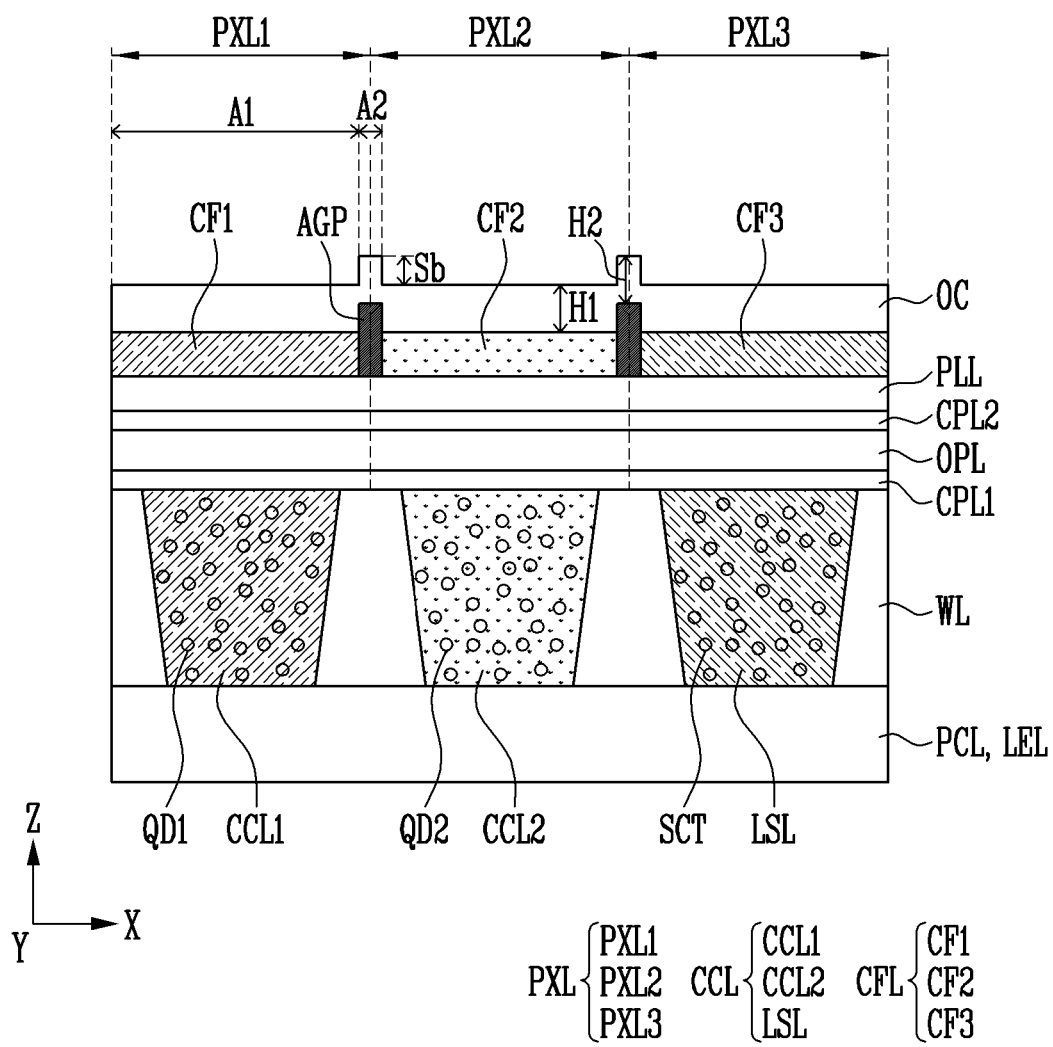

Referring to FIGS. 15 and 16, the overcoat layer OC may be thereafter formed on the first to third color filters CF1, CF2, and CF3 and/or the protrusion patterns AGP, thus completing the display device illustrated in FIG. 8. The overcoat layer OC may be formed with a uniform thickness on the first to third color filters CF1, CF2, and CF3 and/or the protrusion patterns AGP.

For example, the overcoat layer OC may be formed by applying overcoat ink OCI through an inkjet printing operation and hardening the overcoat ink OCI. The overcoat ink OCI may be provided on the color conversion layer CCL by an inkjet printing device Ti. The overcoat ink OCI may be a liquid ink, and may be discharged or sprayed onto the first to third color filters CF1, CF2, and CF3 and/or the protrusion patterns AGP by a nozzle of the inkjet printing device Ii or the like.

The overcoat layer OC may be formed with a uniform thickness on the color filter layer CFL and/or the protrusion pattern AGP. The overcoat layer OC may be formed with a uniform thickness in a shape corresponding to the step difference Sa between the color filter layer CFL and the protrusion pattern AGP. For example, the overcoat layer OC may include a first area A1 over each of the first to third color filters CF1, CF2, and CF3, and a second area A2 over each of the protrusion patterns AGP. A thickness H1 of the first area A1 with respect to the third direction (the Z-axis direction) may be substantially the same as a thickness H2 of the second area A2 with respect to the third direction (the Z-axis direction). For example, the thickness H1 of the first area A1 of the overcoat layer OC with respect to the third direction (the Z-axis direction) and the thickness H2 of the second area A2 with respect to the third direction (the Z-axis direction) may be about 10 μm or less, but the disclosure is not limited thereto.

In case that the overcoat layer OC is formed with a uniform thickness in a shape corresponding to the step difference Sa between the color filter layer CFL and the protrusion pattern AGP, a step difference Sb may be formed between the first area A1 and the second area A2. In case that the first area A1 and the second area A2 of the overcoat layer OC form the step difference Sb, bent portions may be formed on the surface of the display panel PNL. The bent portions may scatter external light, whereby reducing glare from the display panel PNL. Therefore, as described above, a separate antiglare film, which may be attached to the display panel PNL, may be omitted, simplifying the fabricating process, and reducing production costs. To have antiglare characteristics in the display panel PNL, the step difference Sb between the first area A1 and the second area A2 may be in a range of about 2 μm to about 5 μm, but the disclosure is not limited thereto. Furthermore, the step difference Sb between the first area A1 and the second area A2 may be substantially the same as the step difference Sa between the color filter layer CFL and the protrusion pattern AGP, but the disclosure is not limited thereto.

To form the overcoat layer OC with a uniform thickness in a shape corresponding to the step difference Sa between the color filter layer CFL and the protrusion pattern AGP, the viscosity of the overcoat ink OCI may be in a range of about 4 cP to about 20 cP. Furthermore, the weight-average molecular weight of the overcoat ink OCI may be about 30,000 or more. In case that the overcoat ink OCI is formed of material having a relatively low molecular weight, the space filling property of the overcoat ink OCI is increased, so that the step difference Sa between the color filter layer CFL and the protrusion pattern AGP is reduced, and the bent portions may not be formed on the surface of the display panel PNL. Hence, the antiglare characteristics may not be obtained. For example, the overcoat ink OCI may include a polyhedral oligomeric silsesquioxane (POSS) compound. For example, the overcoat ink OCI may be a polysiloxane compound having the following chemical formula A, B, or C or a combination thereof.

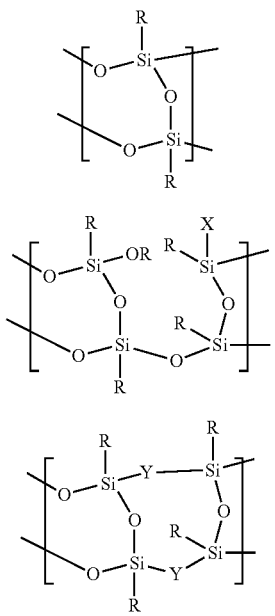

<Chemical Formula A>

<Chemical Formula B>

<Chemical Formula C>

In an embodiment, the polysiloxane compound may include at least two of the chemical formulas A, B, and C. For example, the polysiloxane compound may be represented by the following chemical formulas 1 to 7.

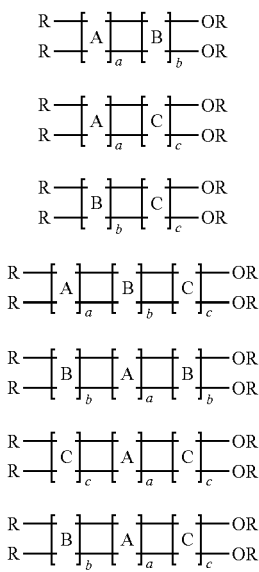

<Chemical Formula 1>

<Chemical Formula 2>

<Chemical Formula 3>

<Chemical Formula 4>

<Chemical Formula 5>

<Chemical Formula 6>

<Chemical Formula 7>

In the chemical formulas, each X may independently indicate R or $[(SiO_{3/2}R)_{4+2n}O]$. Each Y may independently indicate O, NR, or $[(SiO_{3/2}R)_{4+2n}O]$. Each R may independently indicate hydrogen, heavy hydrogen, halogen, an amine group, an epoxy group, a cyclohexyl epoxy group, an acrylic group, a methacrylic group, a thiol group, an isocyanate group, a nitrile group, a nitro group, a phenyl group (substituted with or not substituted with hydrogen, heavy hydrogen, halogen, an amine group, an epoxy group, a cyclohexyl epoxy group, an acrylic group, a methacrylic group, a thiol group, an isocyanate group, a nitrile group, a nitro group), an alkyl group of $C_1$ to $C_{12}$, an alkenyl group of $C_2$ to $C_{12}$, an alkoxy group of $C_1$ to $C_{40}$, a cycloalkyl group of $C_3$ to $C_{12}$, a heterocycloalkyl group of $C_3$ to $C_{12}$, an aryl group $C_6$ to $C_{12}$, a heteroaryl group $C_3$ to $C_{12}$, an aralkyl group of $C_3$ to $C_{12}$, an aryloxy group of $C_3$ to $C_{12}$, or an arycyol group of $C_3$ to $C_{12}$. Furthermore, a, b, and c may each be an integer, independently ranging from 1 to 100.

In the embodiments of the disclosure, a protrusion pattern and a color filter may form a step difference, and an overcoat layer may be formed with a uniform thickness in a shape corresponding to the step difference. Hence, a curved portion may be formed on a surface of the display panel. Therefore, external light may be scattered on the surface of the display panel mitigating glare. Thus, a separate antiglare film, which may be attached to the display panel, may be omitted, simplifying the fabricating process, and reducing production costs.

The effects of the disclosure are not limited by the foregoing, and other effects are anticipated herein.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A display device comprising:
   pixels disposed on a substrate;
   color filters disposed on the substrate and overlapping the pixels in a plan view;
   protrusion patterns disposed on a boundary between the pixels, the protrusion patterns and the color filters having a step difference; and
   an overcoat layer having a uniform thickness disposed on the color filters and the protrusion patterns.

2. The display device according to claim 1, wherein the overcoat layer includes:
   a first area overlapping each of the color filters in a plan view; and
   a second area overlapping each of the protrusion patterns in a plan view.

3. The display device according to claim 2, wherein the first area and the second area have a step difference.

4. The display device according to claim 1, wherein a thickness of the overcoat layer is about 10 μm or less.

5. The display device according to claim 1, wherein the step difference of the protrusion patterns and the color filters is in a range of about 2 μm to about 5 μm.

6. The display device according to claim 1, wherein
   the pixels comprise:
   a first pixel;
   a second pixel; and
   a third pixel, and
   the color filters comprise:
   a first color filter overlapping the first pixel in a plan view;
   a second color filter overlapping the second pixel in a plan view; and
   a third color filter overlapping the third pixel in a plan view.

7. The display device according to claim 6, wherein the protrusion patterns comprise:
a first color pattern;
a second color pattern; and
a third color pattern, and
the first color pattern, the second color pattern, and the third color pattern, and the first color filter, the second color filter, and the third color filter respectively include a same material.

8. The display device according to claim 1, wherein each of the protrusion patterns includes a light shielding layer.

9. The display device according to claim 1, further comprising:
electrodes disposed in the pixels, the electrodes being spaced apart from each other; and
light emitting elements disposed between the electrodes.

10. The display device according to claim 9, wherein each of the light emitting elements comprises:
a first semiconductor layer;
a second semiconductor layer; and
an active layer disposed between the first semiconductor layer and the second semiconductor layer.

11. The display device according to claim 1, wherein the overcoat layer includes a polyhedral oligomeric silsesquioxane (POSS) compound.

12. A method of fabricating a display device, comprising:
preparing a substrate that includes pixels;
forming color filters that overlap the pixels in a plan view;
forming protrusion patterns on a boundary between the pixels, the protrusion patterns and the color filters having a step difference; and
forming an overcoat layer having a uniform thickness on the color filters and the protrusion patterns.

13. The method according to claim 12, wherein the forming of the overcoat layer comprises applying an overcoat ink by inkjet printing.

14. The method according to claim 13, wherein a viscosity of the overcoat ink is in a range of about 4 cP to about 20 cP.

15. The method according to claim 13, wherein the overcoat ink has a weight-average molecular weight of about 30,000 or more.

16. The method according to claim 13, wherein the overcoat ink includes a polyhedral oligomeric silsesquioxane (POSS) compound.

17. The method according to claim 12, wherein the step difference of the protrusion patterns and the color filters is in a range of about 2 μm to about 5 μm.

18. The method according to claim 12, further comprising:
forming electrodes on the substrate, the electrodes being spaced apart from each other; and
aligning light emitting elements between the electrodes.

19. The method according to claim 18, further comprising:
forming a color conversion layer between the light emitting elements and the color filters.

20. The method according to claim 12, wherein the protrusion patterns are formed of color patterns, the color patterns and the color filters including a same material.

* * * * *